(12) United States Patent
Choi et al.

(10) Patent No.: US 10,756,185 B2
(45) Date of Patent: Aug. 25, 2020

(54) SEMICONDUCTOR DEVICE INCLUDING VERTICAL CHANNEL LAYER AND METHOD OF MANUFACTURING THE SAME

(71) Applicant: SAMSUNG ELECTRONICS CO., LTD., Suwon-si, Gyeonggi-do (KR)

(72) Inventors: Ji-hoon Choi, Seongnam-si (KR); Hong-suk Kim, Yongin-si (KR); Sung-gil Kim, Yongin-si (KR); Phil-ouk Nam, Yongin-si (KR); Seul-ye Kim, Seoul (KR); Han-jin Lim, Seoul (KR); Jae-young Ahn, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 106 days.

(21) Appl. No.: 15/646,184

(22) Filed: Jul. 11, 2017

(65) Prior Publication Data

US 2018/0122907 A1    May 3, 2018

(30) Foreign Application Priority Data

Nov. 1, 2016 (KR) ........................ 10-2016-0144482

(51) Int. Cl.

| | | |
|---|---|---|
| *H01L 29/10* | (2006.01) | |
| *H01L 27/11* | (2006.01) | |
| *H01L 27/11565* | (2017.01) | |
| *H01L 27/11524* | (2017.01) | |
| *H01L 27/11556* | (2017.01) | |
| *H01L 27/1157* | (2017.01) | |
| *H01L 27/11582* | (2017.01) | |

(52) U.S. Cl.
CPC ...... *H01L 29/1037* (2013.01); *H01L 27/1157* (2013.01); *H01L 27/11524* (2013.01); *H01L 27/11556* (2013.01); *H01L 27/11565* (2013.01); *H01L 27/11582* (2013.01)

(58) Field of Classification Search
CPC .......... H01L 29/1037; H01L 27/11524; H01L 27/11556; H01L 27/1157; H01L 27/11582
USPC .......................... 257/314; 438/201, 211, 257
See application file for complete search history.

(56) References Cited

U.S. PATENT DOCUMENTS

| 8,426,302 B2 | 4/2013 | Matsushita et al. |
| 8,450,176 B2 | 5/2013 | Son et al. |

(Continued)

FOREIGN PATENT DOCUMENTS

JP          2011-199194 A       10/2011

*Primary Examiner* — Didarul A Mazumder
(74) *Attorney, Agent, or Firm* — Lee IP Law, P.C.

(57) ABSTRACT

A semiconductor device includes a substrate, a plurality of gate electrodes extending in a first direction parallel to an upper surface of a substrate on the substrate, and alternately arranged with an interlayer insulating layer in a second direction perpendicular to the upper surface of the substrate, a vertical channel layer on a sidewall of a vertical channel hole extending in the second direction by penetrating through the plurality of gate electrodes and the interlayer insulating layer, and connected to the upper surface of the substrate, and a first gap-fill insulating layer formed in the vertical channel hole and including an outer wall contacting the vertical channel layer and an inner wall opposite the outer wall, wherein a part of the inner wall forms a striation extending in the second direction.

20 Claims, 25 Drawing Sheets

(56) References Cited

U.S. PATENT DOCUMENTS

| | | |
|---|---|---|
| 8,841,183 B2 | 9/2014 | Ozawa |
| 8,860,031 B2 | 10/2014 | Mori |
| 9,379,132 B2 | 6/2016 | Koka et al. |
| 9,384,998 B2 | 7/2016 | Hudson et al. |
| 2010/0140684 A1* | 6/2010 | Ozawa .............. H01L 21/28282 257/324 |
| 2014/0035026 A1* | 2/2014 | Jang .................... H01L 29/792 257/324 |
| 2015/0097222 A1 | 4/2015 | Lee et al. |
| 2015/0179661 A1* | 6/2015 | Huo .................... H01L 21/764 257/57 |

* cited by examiner

SEMICONDUCTOR DEVICE INCLUDING VERTICAL CHANNEL LAYER AND METHOD OF MANUFACTURING THE SAME

CROSS-REFERENCE TO RELATED APPLICATION

Korean Patent Application No. 10-2016-0144482, filed on Nov. 1, 2016, in the Korean Intellectual Property Office, and entitled: "Semiconductor Devices and Method of Manufacturing the Same," is incorporated by reference herein in its entirety.

BACKGROUND

1. Field

Embodiments relate to a semiconductor device and a method of manufacturing the same, and more particularly, to a semiconductor device including a vertical channel layer and a method of manufacturing the same.

2. Description of the Related Art

As the integration density of memory devices has increased, a memory device having a vertical transistor structure has been proposed for use instead of a conventional memory device having a horizontal transistor structure. The memory device having a vertical transistor structure includes a vertical channel layer extending in a vertical direction on a substrate. However, the memory device is downscaled, the electrical characteristics of the vertical channel layer are reduced and manufacturing the vertical channel layer becomes complicated.

SUMMARY

According to an aspect of one or more embodiments, there is provided a semiconductor device including a substrate; a plurality of gate electrodes on the substrate, extending in a first direction parallel to an upper surface of the substrate, and alternately laminated with an interlayer insulating layer in a second direction perpendicular to the upper surface of the substrate; a vertical channel layer disposed on a sidewall of a vertical channel hole extending in the second direction by penetrating through the plurality of gate electrodes and the interlayer insulating layer, and connected to the upper surface of the substrate; and a first gap-fill insulating layer formed in the vertical channel hole and including an outer wall contacting the vertical channel layer and an inner wall opposite the outer wall, wherein a part of the inner wall forms a striation extending in the second direction.

According to another aspect of one or more embodiments, there is provided a semiconductor device including a substrate; a plurality of gate electrodes on the substrate, extending in a first direction parallel to an upper surface of the substrate, and alternately laminated with an interlayer insulating layer in a second direction perpendicular to the upper surface of the substrate; a vertical channel layer disposed on a sidewall of a vertical channel hole extending in the second direction by penetrating through the plurality of gate electrodes and the interlayer insulating layer, wherein a part of the vertical channel layer has a non-uniform thickness at a first vertical level corresponding to the upper surface of the substrate; and a first gap-fill insulating layer formed in the vertical channel hole and including an outer wall contacting the vertical channel layer and an inner wall opposite the outer wall, wherein the first gap-fill insulating layer has a non-uniform thickness at the first vertical level.

According to another aspect of one or more embodiments, there is provided a semiconductor device, including a substrate, a plurality of gate electrodes on the substrate, the plurality of gate electrodes extending in a first direction parallel to an upper surface of the substrate and alternately arranged with an interlayer insulating layer in a second direction perpendicular to the upper surface of the substrate, a vertical channel layer on a sidewall of a vertical channel hole extending in the second direction by penetrating through the plurality of gate electrodes and the interlayer insulating layer, and in contact with the upper surface of the substrate, and a first gap-fill insulating layer in the vertical channel hole, the first gap-fill layer being an oxide of the vertical channel layer.

BRIEF DESCRIPTION OF THE DRAWINGS

Features will become apparent to those of skill in the art by describing in detail exemplary embodiments with reference to the attached drawings in which.

DETAILED DESCRIPTION OF THE EMBODIMENTS

Reference will now be made in detail to embodiments, examples of which are illustrated in the accompanying drawings.

Figure 1:
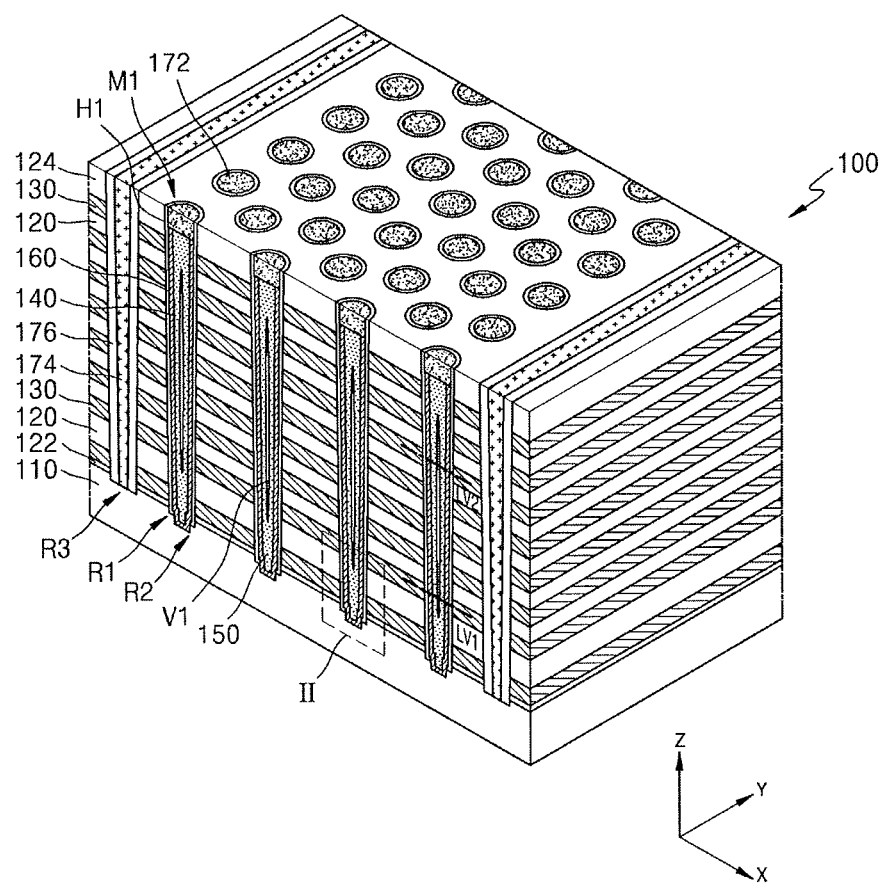
FIG. 1 is a perspective view of a representative structure of a semiconductor device according to example embodiments.
Figure 2:
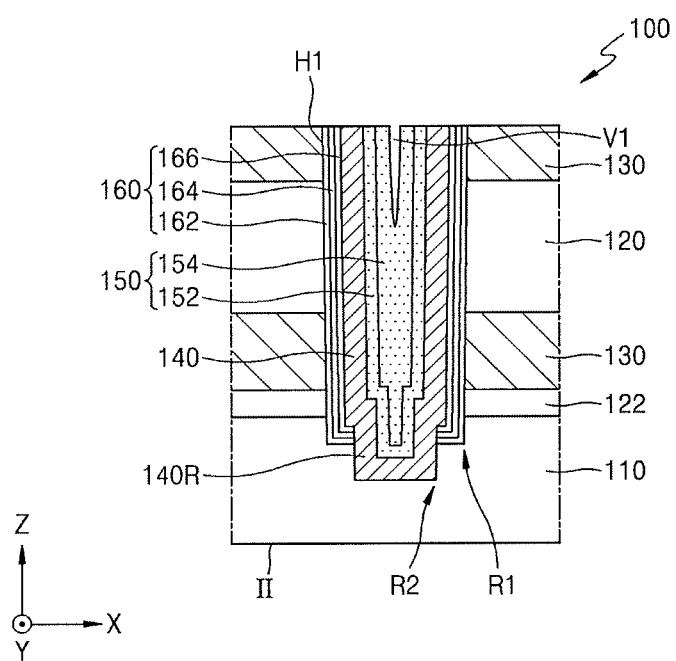
FIG. 2 illustrates an enlarged cross-sectional view of a part II of FIG. 1.
Figure 3A:
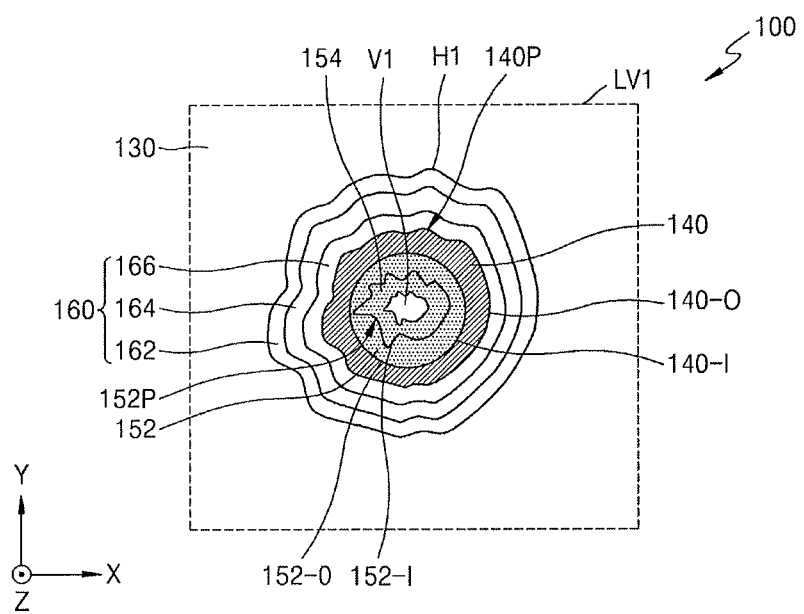
FIG. 3A illustrates a vertical cross-sectional view at a first vertical level LV1 of FIG. 1.
Figure 3B:
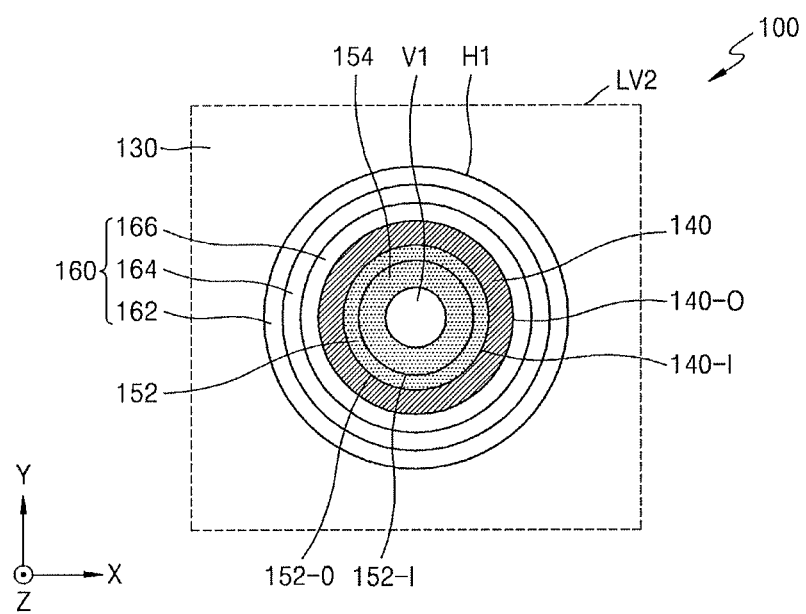
FIG. 3B illustrate a vertical cross-sectional view at a second vertical level LV2 of FIG. 1 according to example embodiments.

FIG. 1 is a perspective view of a representative structure of a semiconductor device 100 according to example embodiments. FIG. 2 is an enlarged cross-sectional view of a part II of FIG. 1 according to example embodiments. FIG. 3A is a vertical cross-sectional view at a first vertical level LV1 of FIG. 1 according to example embodiments, and FIG. 3B is a vertical cross-sectional view at a second vertical level LV2 of FIG. 1 according to example embodiments. Some components such as a bit line, a bit line contact, a word line contact plug, or a word line contact pad are omitted in FIG. 1 for convenience of illustration.

Referring to FIGS. 1 to 3B, a substrate 110 may have a major surface extending in a first direction (an X direction) and a second direction (a Y direction). The substrate 110 may include a semiconductor material, for example, a group IV semiconductor, a group III-V compound semiconductor, or a group II-VI oxide semiconductor. For example, a group IV semiconductor may include silicon (Si), germanium (Ge), or Si—Ge. The substrate 110 may also be provided as a bulk wafer or an epitaxial layer. A cell area in which a plurality of memory cell strings M1 are disposed and a peripheral area disposed outside the cell area may be defined on the substrate 110.

An interlayer insulating layer 120 and a plurality of gate electrodes 130 may be alternately laminated on the cell area of the substrate 110 in a third direction (a Z direction) perpendicular to the major surface of the substrate 110. For example, as illustrated in FIG. 1, two of the gate electrodes 130 adjacent to each other may be spaced apart from each other in the third direction (a Z direction), with the interlayer insulating layers 120 interposed therebetween. As illustrated in FIG. 1, the semiconductor device 100 includes eight gate electrodes 130 stacked along the third direction. However, the embodiments are not limited thereto and the number of gate electrodes 130 may be 16, 24, 32, 48, 64, 96, 128, and so on. For example, when the plurality of memory cell strings M1 include eight gate electrodes 130, the lowermost gate electrode 130 may be a ground selection line forming a ground selection line transistor, the uppermost gate electrode 130 may be a string selection line forming a string selection line transistor, and the gate electrodes 130 between the uppermost and the lowermost gate electrodes 130 may be word lines forming a memory cell transistor. The number of gate electrodes 130 may differ according to capacity of the plurality of memory cell strings M1.

A lower insulating layer 122 may be interposed between the substrate 110 and the lowermost gate electrode 130. A thickness of the lower insulating layer 122 may be less than that of the interlayer insulating layer 120 in a vertical direction (third or Z direction). However, the embodiments are not limited thereto.

An upper insulating layer 124 may be disposed on the uppermost gate electrode 130. A thickness of the upper insulating layer 124 may be greater than that of the interlayer insulating layer 120 in a vertical direction (third or Z direction). However, embodiments are not limited thereto. As illustratively shown in FIG. 1, the upper insulating layer 124 may be a single insulating material layer. Alternatively, the upper insulating layer 124 may also have a layered structure of two or more insulating material layers including different materials.

A vertical channel layer 140 may be disposed to extend in the third direction (a Z direction) by penetrating through the interlayer insulating layer 120 and the plurality of gate electrodes 130. A plurality of vertical channel layers 140 may be spaced apart from one another with predetermined gaps therebetween in the first direction (an X direction) and the second direction (a Y direction) parallel to an upper surface of the substrate 110. A bottom portion 140R of the vertical channel layer 140 may contact the upper surface of the substrate 110. The vertical channel layer 140 may be disposed on the inner wall of a vertical channel hole H1 exposing the upper surface of the substrate 110 by penetrating through the interlayer insulating layer 120 and the plurality of gate electrodes 130.

As illustratively shown in FIG. 3A, the vertical channel layer 140 may include an outer wall 140-O and an inner wall 140-I. The outer wall 140-O of a lower portion the vertical channel layer 140, e.g., at a level LV1 closer to the substrate 110 than to an upper surface of the device 100, may form a striation extending in the third direction. However, the inner wall 140-I of the lower portion of the vertical channel layer 140 may form a substantially flat and continuous surface different from a striation. In particular, at a level LV1, the inner wall 140-I may be substantially circular, while the outer wall 140-O may include projections therein, e.g., projections that extend in the first and/or second directions (X and/or Y directions, e.g., in a plane orthogonal to the Z direction), such that a thickness thereof is non-uniform. As illustratively shown in FIG. 3B, both the outer wall 140-O and the inner wall 140-I of an upper portion the vertical channel layer 140, e.g., at a level LV2 closer to the upper surface of the device 100 than to the substrate 110, may form a substantially flat and continuous surface, e.g., substantially circular, different from a striation. The striation will be described in detail later below.

A gap-fill insulating layer structure 150 may be disposed on the inner wall 140-I of the vertical channel layer 140 to fill the inner wall of the vertical channel hole H1. The gap-fill insulating layer structure 150 may include a first gap-fill insulating layer 152 contacting the vertical channel layer 140 and a second gap-fill insulating layer 154 surrounded by the first gap-fill insulating layer 152. A void V1 may be formed in the second gap-fill insulating layer 154. However, unlike FIG. 1, the first and second gap-fill insulating layers 152 and 154 may completely fill the vertical channel hole H1 without forming the void V1 in the vertical channel hole H1.

In some example embodiments, the first gap-fill insulating layer 152 may include a silicon oxide (SiOx). For example, the first gap-fill insulating layer 152 may include SiOx formed from a part of the vertical channel layer 140 by performing an annealing process with an oxygen reduction catalyst in operation S110 (see FIG. 10A) on a conductive layer 140C to form the vertical channel layer 140. In some example embodiments, the first gap-fill insulating layer 152 may include SiOx formed from a part of the vertical channel layer 140 by performing an oxidation process (operation S130, see FIG. 15) on the conductive layer 140C to form the vertical channel layer 140.

In some example embodiments, the second gap-fill insulating layer 154 may include SiOx, a silicon oxynitride (SiON), a silicon nitride (SiNx), silicon oxycarbonitride (SiOCN), or a combination thereof. The second gap-fill insulating layer 154 may be formed by using a chemical vapor deposition (CVD) process, an atomic layer deposition (ALD) process, etc.

As illustratively shown in FIG. 3A, the first gap-fill insulating layer 152 includes an outer wall 152-O and an inner wall 152-I. At a lower portion of the first gap-fill insulating layer 152, e.g., at the level LV1 that is closer to the substrate 110 than to the upper surface of the device 100, the inner wall 152-I may form a striation extending in the third direction, while the outer wall 152-O may form a flat surface different from a striation, e.g., a substantially circular surface. In other words, a thickness of the first gap-fill insulating layer 152 may be non-uniform. As illustratively shown in FIG. 3B, at an upper portion of the first gap-fill insulating layer 152, e.g., at the level LV2 that is closer to the upper surface of the device 100 than to the substrate 110, both the outer wall 152-O and the inner wall 152-I may form a flat surface different from a striation, e.g. a substantially circular surface.

A gate insulating layer 160 may be disposed between the vertical channel layer 140 and the gate electrode 130, and between the vertical channel layer 140 and the interlayer insulating layer 120. The gate insulating layer 160 may surround the outer wall 140-O of the vertical channel layer 140 and may extend along an inner wall of the vertical channel hole H1 in the third direction (a Z direction). The gate insulating layer 160 may include a blocking insulating layer 162, a charge storage layer 164, and a tunneling insulating layer 166 which are sequentially stacked, e.g., along the first and second directions (X and Y directions). As illustrated in FIGS. 3A and 3B, the tunneling insulating layer 166 may contact the outer wall 140-O of the vertical channel layer 140, and the blocking insulating layer 162 may contact the gate electrode 130 and the interlayer insulating layer 120.

In some example embodiments, the blocking insulating layer 162 may include a high-dielectric constant material (or a high-k material). For example, the blocking insulating layer 162 may include a high-dielectric constant metal oxide such as a hafnium oxide ($HfO_2$), a zirconium oxide (ZrOx), an aluminum oxide ($Al_2O_3$), a tantalum oxide (TaOx), an yttrium oxide ($Y_2O_3$), a lanthanum oxide ($La_2O_3$), SiNx, SiON or combinations thereof. However, the materials of the blocking insulating layer 162 are not limited thereto. Furthermore, the blocking insulating layer 162 may be a structure in which two or more materials having different dielectric constants are stacked. The charge storage layer 164 may include SiNx or polysilicon. Furthermore, the charge storage layer 164 may also include a quantum dot or a nanocrystal. The tunneling insulating layer 166 may include SiOx.

A barrier layer may further be formed between the blocking insulating layer 162 and the gate electrode 130 and/or between the interlayer insulating layer 120 and the gate electrode 130. The barrier layer may prevent a direct contact between the gate electrode 130 and the gate insulating layer 160. The barrier layer may include a high-dielectric constant metal oxide such as $HfO_2$, ZrOx, $Al_2O_3$, TaOx, $Y_2O_3$, $La_2O_3$, SiNx, SiON or combinations thereof.

In some example embodiments, a first recess area R1 may be formed in a bottom portion of the vertical channel hole H1. Thus, a bottom surface of the vertical channel hole H1 may be lower than that of the lower insulating layer 122. As illustratively shown in FIGS. 1 and 2, the gate insulating layer 160 may extend to a bottom portion of the first recess area R1 along a sidewall of the vertical channel hole H1. Thus, a bottom surface of the gate insulating layer 160 may be lower than that of the lower insulating layer 122. In particular, the gate insulating layer 160 may extend in the first and second directions toward a center of the vertical channel hole H1, such that the layer therein are stacked in the third direction. In some example embodiments, the first recess area R1 may not be formed in a bottom portion of the vertical channel hole H1. Thus, the bottom surface of the gate insulating layer 160 may be at the same level as that of the lower insulating layer 122.

In some example embodiments, a second recess area R2 may be formed in a bottom portion of the vertical channel hole H1. Thus, a bottom surface of the vertical channel hole H1 may be lower than that of the lower insulating layer 122 and the gate insulating layer 160. The vertical channel layer 140 may extend along a sidewall of the gate insulating layer 160 in the vertical channel hole H1 and the bottom portion 140R of the vertical channel layer 140 may fill the second recess area R2. Thus, a lower surface of the bottom portion 140R of the vertical channel layer 140 may be lower than the bottom surface of the gate insulating layer 160.

Referring to FIG. 1, a conductive pad 172 may be disposed on the vertical channel layer 140 and the gap-fill insulating layer structure 150 in the vertical channel hole H1. The conductive pad 172 may serve as a drain region for a memory cell string M1. In some example embodiments, the conductive pad 172 may include polysilicon doped with impurities.

A bit line extending in the first direction (an X direction) may be disposed on the conductive pad 172, a bit line contact may be disposed between the bit line and the conductive pad 172, and the memory cell string M1 may be electrically connected to the bit line. In some example embodiments, the bit line may be directly connected to the conductive pad 172 and the bit line contact may be omitted.

A common source line 174 may extend in the second direction (a Y direction) on the upper surface of the substrate 110 and may be spaced apart from the vertical channel layer 140. A common source line spacer 176 may be disposed on each sidewall of the common source line 174 and may electrically insulate the gate electrode 130 from the common source line 174. Although FIG. 1 illustratively shows that an upper surface of the common source line 174 and the common source line spacer 176 is at the same level as that of the upper insulating layer 124, an upper surface of the common source line 174 may be lower than that of the upper insulating layer 124. In some example embodiments, the common source line 174 may include a conductive material, for example, a metal such as tungsten, aluminum, copper, titanium, or tantalum, polysilicon doped with impurities, and a metal silicide such as nickel silicide, titanium silicide, tungsten silicide, or cobalt silicide. A third recess area R3 may be formed in the substrate 110 below the common source line 174, and a bottom portion of the common source line 174 may fill the third recess area R3.

Hereinafter, shapes of the vertical channel hole H1, the vertical channel layer 140, and the gap-fill insulating layer structure 150 will be described in detail with reference to FIGS. 3A and 3B.

As illustrated in FIGS. 3A and 3B, each vertical channel hole H1 may have a different shape at a different height. For example, a width of a vertical channel hole H1 at the first vertical level LV1 relatively close to an upper surface of the substrate 110 may be less than a width of a vertical channel hole H1 at the second vertical level LV2 relatively far from the upper surface of the substrate 110.

For example, a part of a sidewall of the vertical channel hole H1 at the first vertical level LV1 relatively close to an upper surface of the substrate 110 may form a striation. The sidewall of the vertical channel hole H1 at the first vertical level LV1 may have a polygonal-shaped or star-shaped vertical cross-section including a plurality of projecting portions. Here, a vertical cross-section of a sidewall (or an outer wall or an inner wall) indicates a shape obtained by an outline of the sidewall (or the outer wall or the inner wall). FIG. 3A schematically shows the polygonal-shaped or star-shaped vertical cross-section as an example. Here, a shape of a sidewall of the vertical channel hole H1, which is formed by extending a plurality of projecting portions in the third direction (a Z direction) perpendicular to an upper surface of the substrate 110, is referred to as a striation. The striation may be formed, e.g., in a lower portion of a sidewall of the vertical channel hole H1.

In contrast, a sidewall of the vertical channel hole H1 at the second vertical level LV2 relatively far from an upper surface of the substrate 110 may be flat and continuous different from a striation. The sidewall of the vertical channel hole H1 at the second vertical level LV2 may have a substantially circular-shaped vertical cross-section. FIG. 3B schematically shows the circular-shaped vertical cross-section as an example. For example, an upper portion of a sidewall of the vertical channel hole H1 may have a flat and continuous surface.

In general, a mask pattern is formed on a laminate of the interlayer insulating layer 120 and a sacrificial layer 126 (see FIG. 7) to form the vertical channel hole H1, and the laminate is etched by using the mask pattern as an etching mask. When a laminate with an increased height is etched (or when a laminate including a large number of sacrificial layers is etched), a mask pattern may be damaged or consumed with the lapse of an etching time and/or as a depth of the vertical channel hole H1 increases (because the mask pattern is disposed farther from a portion of the laminate to be etched). As a result, a sidewall profile of the vertical channel hole H1 may differ. Therefore, a lower portion of a sidewall of the vertical channel hole H1 far from an upper surface of the laminate (for example, at the first vertical level LV1) may form a striation.

The gate insulating layer 160 may be conformally formed on a sidewall of the vertical channel hole H1. For example, the gate insulating layer 160 may be formed with a uniform thickness along a sidewall of the vertical channel hole H1 forming a striation at the first vertical level LV1.

As illustratively shown in FIG. 3A, shapes of the inner wall 140-I and the outer wall 140-O may be asymmetrical in the first vertical channel layer 140. For example, the inner wall 140-I and the outer wall 140-O may have different morphologies. The vertical channel layer 140 may be disposed in the vertical channel hole H1 to be surrounded by the gate insulating layer 160. The vertical channel layer 140 may include the outer wall 140-O contacting the gate insulating layer 160 and the inner wall 140-I opposite the outer wall 140-O. The outer wall 140-O of the vertical channel layer 140 at the first vertical level LV1 may form a striation along the striation of the vertical channel hole H1. The outer wall 140-O of the vertical channel layer 140 has a vertical cross-section including a plurality of projecting portions 140P, and may form a striation on the outer wall 140-O of the vertical channel layer 140 as the plurality of projecting portions 140P extend in the third direction (a Z direction). A shape of the inner wall 140-I of the vertical channel layer 140 at the first vertical level LV1 may be relatively flat and continuous (or may have fewer recesses). The inner wall 140-I of the vertical channel layer 140 may have a substantially circular-shaped or oval-shaped vertical cross-section.

Furthermore, the first gap-fill insulating layer 152 may include the inner wall 152-I and the outer wall 152-O with asymmetrical shapes. For example, the inner wall 152-I and the outer wall 152-O may have different morphologies. The first gap-fill insulating layer 152 may be disposed in the vertical channel hole H1 to be surrounded by the vertical channel layer 140. The first gap-fill insulating layer 152 may include the outer wall 152-O contacting the vertical channel layer 140 and the inner wall 152-I opposite the outer wall 152-O. At the first vertical level LV1, the outer wall 152-O of the first gap-fill insulating layer 152 contacts the inner wall 140-I of the vertical channel layer 140 and may have a relatively flat and continuous shape or may have fewer recesses. On the contrary, the inner wall 152-I of the first gap-fill insulating layer 152 may form a striation. The inner wall 152-I of the first gap-fill insulating layer 152 has a vertical cross-section including a plurality of projecting portions 152P, and may form a striation on the inner wall 152-I of the first gap-fill insulating layer 152 as the plurality of projecting portions 152P extend in the third direction.

The inner wall 152-I of the first gap-fill insulating layer 152 has a striation while the outer wall 152-O thereof is flat or has fewer recesses. Accordingly, the first gap-fill insulating layer 152 may have a part with a relatively great thickness t11 (see FIG. 10B) and a part with a relatively small thickness t12 (see FIG. 10B reference). For example, a thickness of the first gap-fill insulating layer 152 around the projecting portions 152P may be greater than a thickness of the remaining part of the first gap-fill insulating layer 152.

In general, a width of the vertical channel hole H1 and a thickness of the vertical channel layer 140 are reduced to downscale a memory device. However, crystal quality of the vertical channel layer 140 with a reduced thickness is not good. Therefore, a method of performing heat treatment for crystallization after forming a vertical channel layer with a greater thickness, and reducing the thickness of the vertical channel layer by a trimming process has been proposed.

However, according to an embodiment, a vertical channel layer 140 having superior crystal quality may be obtained by performing an annealing process with an oxygen reduction catalyst in operation S110 (see FIG. 10A) on the vertical channel layer 140. Furthermore, a part of the vertical channel layer 140 may be oxidized by a predetermined thickness simultaneously with the annealing process with an oxygen reduction catalyst in operation S110. Thus, a part of the vertical channel layer 140 is converted into the first gap-fill insulating layer 152 and the first gap-fill insulating layer 152 having an asymmetrical shape may be obtained. Furthermore, a part of the vertical channel layer 140 may be converted into the first gap-fill insulating layer 152, thus reducing a thickness of the vertical channel layer 140 while the vertical channel layer 140 is crystallized by the annealing process with an oxygen reduction catalyst in operation S110. Thus, a trimming process for reducing a thickness of the vertical channel layer 140 may be omitted.

As a result, the semiconductor device 100 may include the vertical channel layer 140 having superior crystal quality, and therefore, may have superior electrical characteristics. Furthermore, the semiconductor device 100 may be manufactured by a simplified process.

Figure 4:
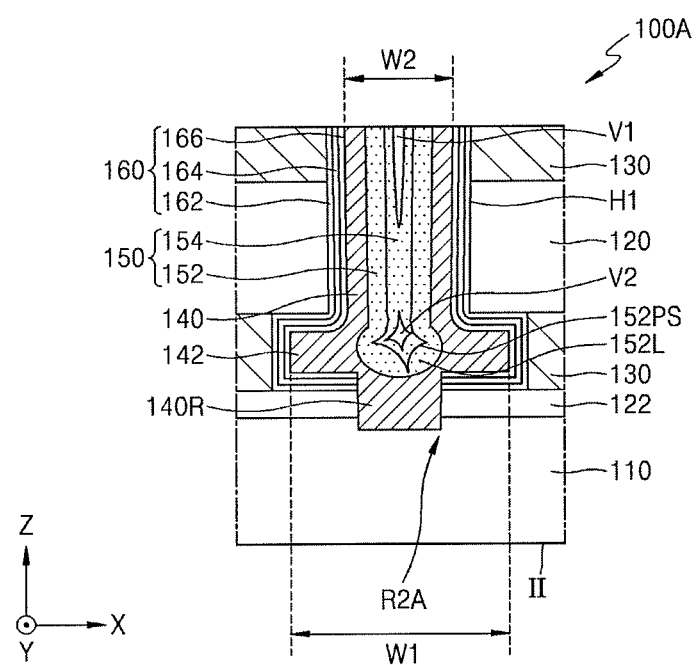
FIG. 4 illustrates a cross-sectional view of a semiconductor device according to example embodiments.

FIG. 4 is a cross-sectional view of a semiconductor device 100A according to example embodiments. FIG. 4 is an enlarged cross-sectional view of part II of FIG. 1 according to another embodiment. In FIG. 4, like reference numerals in FIGS. 1 to 3B denote like elements.

Referring to FIG. 4, the vertical channel layer 140 may further include a lower contact area 142 in a lower portion of the vertical channel layer 140. The lower contact area 142 may contact a lower insulating layer 122 or may have the gate insulating layer 160 there between. The lower contact area 142 may be a part of the vertical channel layer 140 extending in a side direction (first and second directions relative to an upper portion of the vertical channel layer 140 and the lower portion 140R thereof). The lower contact area 142 may include the same material as that of the vertical channel layer 140.

For example, the lower contact area 142 may be disposed in a fourth recess area R4 (see FIG. 16) limited by the lowermost gate electrode 130, and the interlayer insulating layer 120 and the lower insulating layer 122 which may be respectively disposed on and below the lowermost gate electrode 130. The fourth recess area R4, which may be at the same level along the third direction as the lowermost gate electrode 130, may be a space extending in a lateral direction (X and Y directions) from a sidewall of the vertical channel hole H1. The gate insulating layer 160 may be conformally formed on an inner wall of the fourth recess area R4, and the lower contact area 142 filling the fourth recess area R4 may be disposed on the gate insulating layer 160.

As the gate insulating layer 160 is conformally formed on the inner wall of the fourth recess area R4, a bottom surface of the gate insulating layer 160 may be at substantially the same level as that of the lowermost gate electrode 130 and the gate insulating layer 160 may be at a higher level than that of an upper surface of the substrate 110.

The lower contact area 142 may have a first width W1 in the first direction (the X direction of FIG. 1), and the vertical channel layer 140 higher than the lower contact area 142 may have a second width W2 smaller than the first width W1 in the first direction (the X direction). For example, the first width W1 may be 1.5 to 5 times as great as the second width W2, however the first width W1 of the lower contact area 142 is not limited thereto.

The bottom portion 140R of the vertical channel layer 140 may fill a second recess area R2A under the lower contact area 142. The lower contact area 142 may be electrically connected to the substrate 110 by the bottom portion 140R of the vertical channel layer 140.

The lower contact area 142 may surround a lower portion 152L of the first gap-fill insulating layer 152. The lower portion 152L of the first gap-fill insulating layer 152 may include a plurality of projecting surfaces 152PS. A cavity area V2 may be defined by the plurality of projecting surfaces 152PS.

In some example embodiments, a vertical channel layer 140 having superior crystal quality may be obtained by performing the annealing process with an oxygen reduction catalyst in operation S110 (see FIG. 20) on the vertical channel layer 140 including the lower contact area 142. In an exemplary process, a part of the vertical channel hole H1 may be remained empty without fully filling a material of the vertical channel layer 140 in the fourth recess area R4 extending in a lateral direction, and a partial thickness of the vertical channel layer 140 may be converted into the first gap-fill insulating layer 152 by the annealing process with an oxygen reduction catalyst in operation S110.

When a projecting portion 142P of the lower contact area 142 is exposed to the vertical channel hole H1, the projecting portion 142P may be preferentially oxidized by the annealing process with an oxygen reduction catalyst in operation S110 or oxidation speed of the projecting portion 142P may be faster than that of the other portion. Therefore, a thickness of the lower portion 152L of the first gap-fill insulating layer 152 may be relatively great, e.g., may be greater than a thickness of the first gap-fill insulating layer 152 on a sidewall of the vertical channel hole H1. However, embodiments are not limited thereto. Alternatively, the first gap-fill insulating layer 152 may fully fill the empty space of the fourth recess area R4 without forming the cavity area V2 in the lower portion 152L of the first gap-fill insulating layer 152.

The semiconductor device 100A may include the vertical channel layer 140 having superior crystal quality, and furthermore, may be manufactured by a simplified process.

Figure 5:
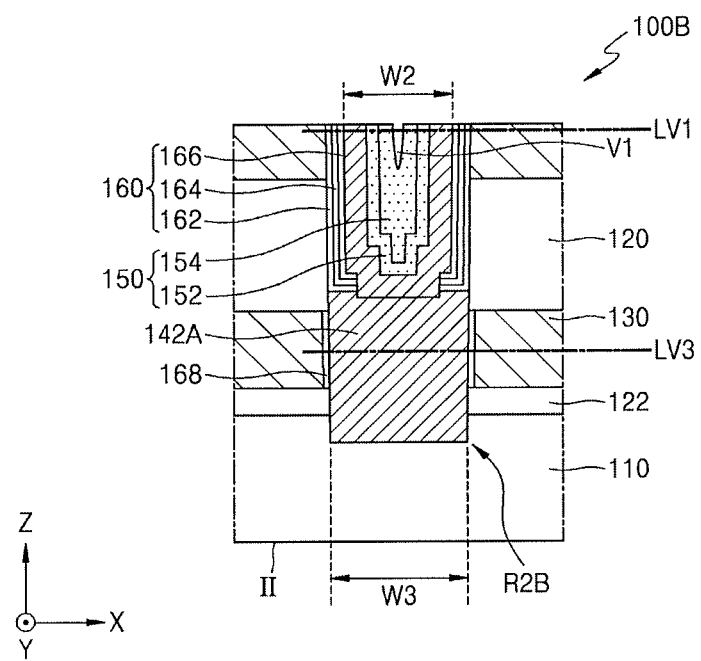
FIG. 5 illustrates a cross-sectional view of a semiconductor device according to example embodiments.
Figure 6A:
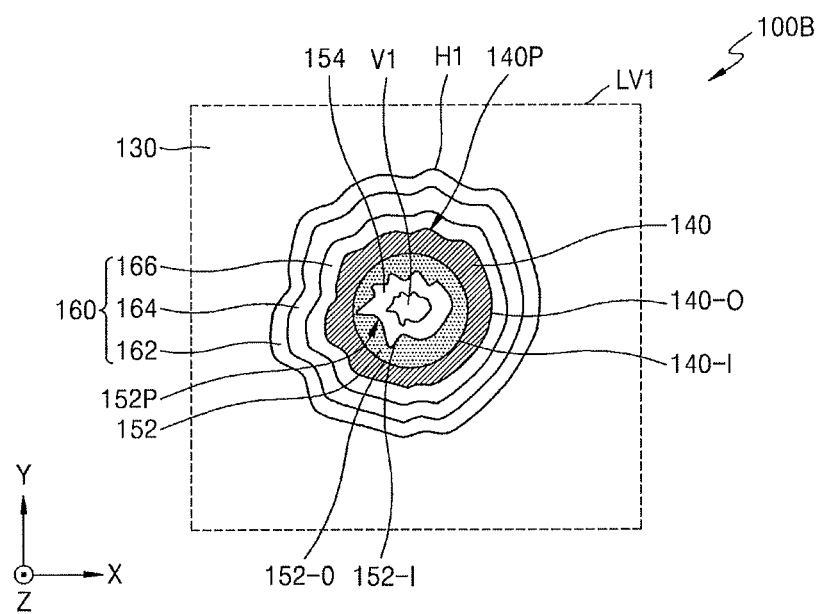
FIG. 6A illustrates a vertical cross-sectional view at a first vertical level LV1 of FIG. 5.
Figure 6B:
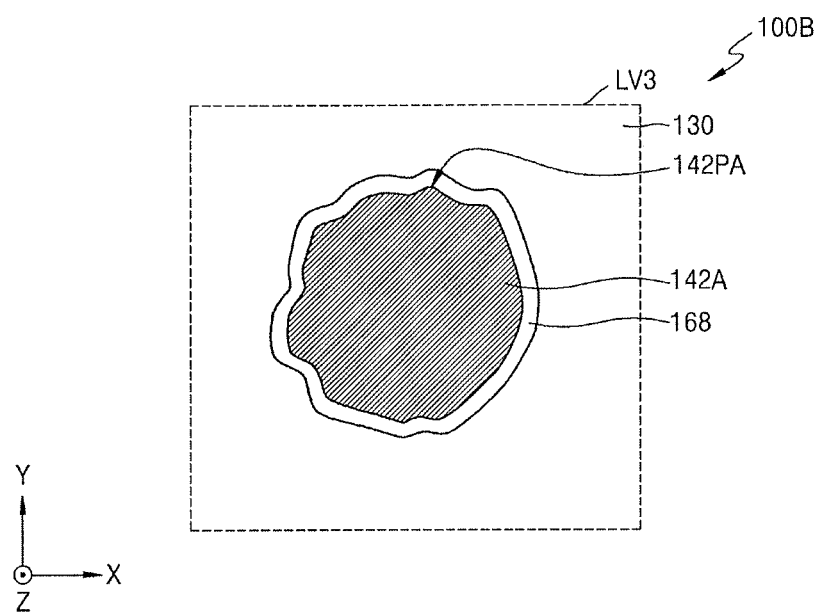
FIG. 6B illustrates a vertical cross-sectional view at a third vertical level LV3 of FIG. 5 according to example embodiments.

FIG. 5 is a cross-sectional view of a semiconductor device 100B according to example embodiments. FIG. 5 is an enlarged cross-sectional view of part II of FIG. 1 according to another embodiment. FIG. 6A is a vertical cross-sectional view at a first vertical level LV1 of FIG. 5, and FIG. 6B is a vertical cross-sectional view at a third vertical level LV3 of FIG. 5. In FIGS. 5 to 6B, like reference numerals in FIGS. 1 to 4 denote like elements.

Referring to FIGS. 5 to 6B, the vertical channel layer 140 further includes a lower contact area 142A, in which the lower contact area 142A may include single crystal silicon grown from an upper surface of the substrate 110 by a selective epitaxial growth process.

A second recess area R2B may be formed in the substrate 110 under the lower contact area 142A, and the lower contact area 142A may fill the second recess area R2B. An upper surface of the lower contact area 142A may be higher than that of the lowermost gate electrode 130 along the third direction (Z direction). A bottom surface of the gate insulating layer 160 may contact the upper surface of the lower contact area 142A, e.g., may extend laterally along the upper surface of the lower contact area, e.g., such that only a blocking insulating layer 162 directly contacts the upper surface of the lower contact area 142A. The bottom portion 140R of the vertical channel layer 140 may extend below the upper surface of the lower contact area 142A, e.g., sidewalls and a bottom surface of the bottom portion 140R may be in contact with the lower contact area 142A. A lower gate insulating layer 168 may be disposed on a sidewall of the lower contact area 142A, e.g., between the lower contact area 142A and the lowermost gate electrode 130 along the lateral directions.

The lower contact area 142A may have a third width W3 in the first direction (the X direction of FIG. 1), and the vertical channel layer 140 higher than the lower contact area 142A may have the second width W2 smaller than the third width W3 in the first direction (the X direction). As illustratively shown in FIG. 6B, the sidewall of the lower contact area 142A may form a striation, or may have a polygonal-shaped or star-shaped vertical cross-section including a plurality of projecting portions 142PA.

In an exemplary process, the lower contact area 142A may be formed in the vertical channel hole H1 forming a striation by a selective epitaxial growth process in which an upper surface of the substrate 110 is used as a seed layer. Here, the sidewall of the lower contact area 142A may form a striation.

The semiconductor device 100B may include the vertical channel layer 140 having superior crystal quality, and furthermore, may be manufactured by a simplified process.

Figure 7:
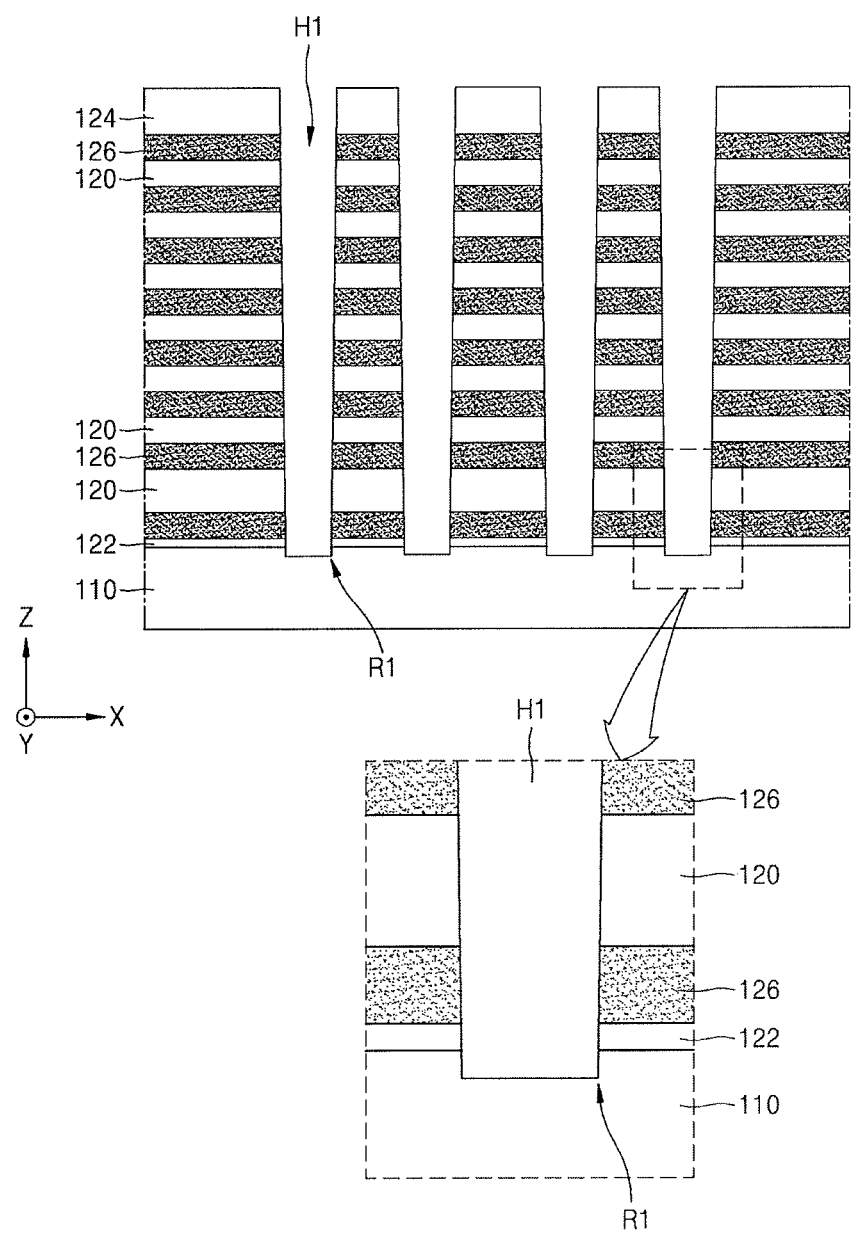
FIGS. 7 and 8, 9A, 10A, and FIGS. 11 to 13 illustrate cross-sectional views of stages in a method of manufacturing a semiconductor device in a processing order according to example embodiments.
Figure 8:
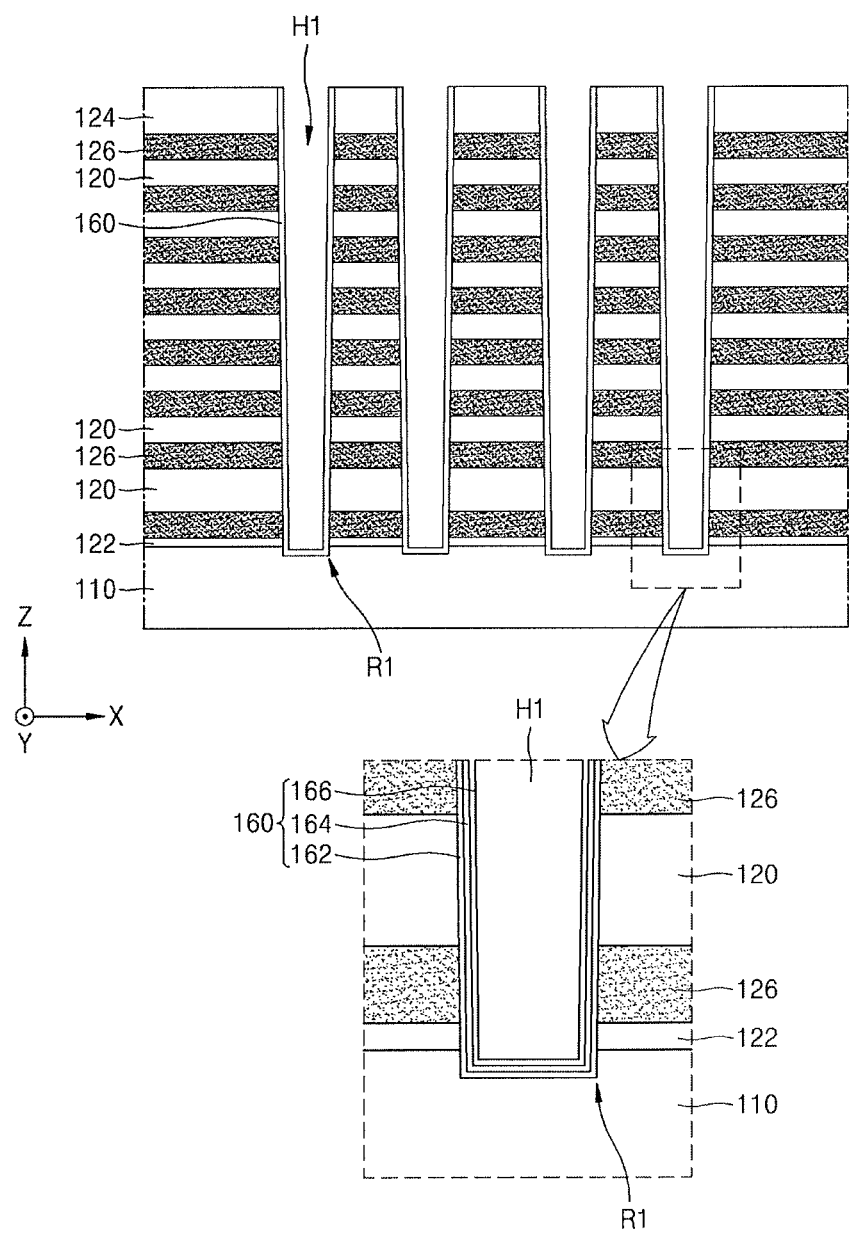
Figure 9A:
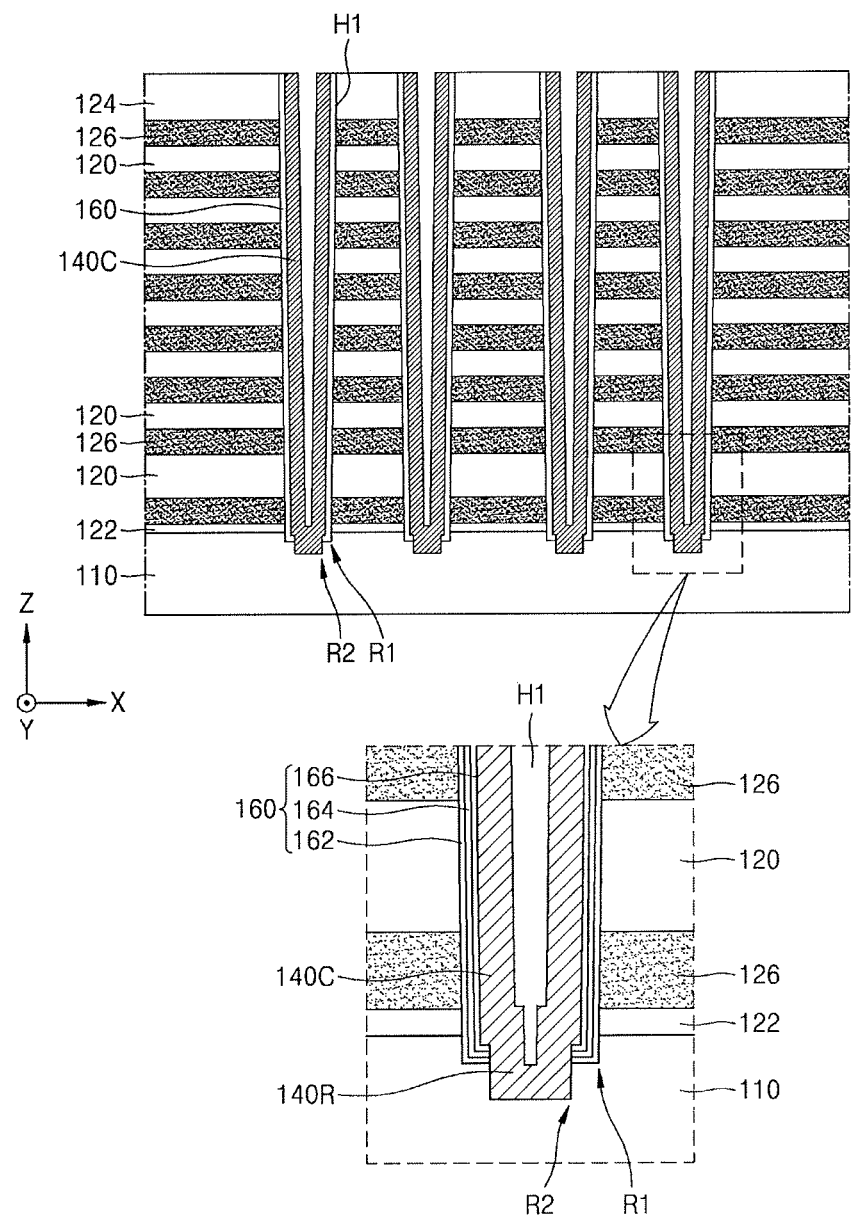
Figure 9B:
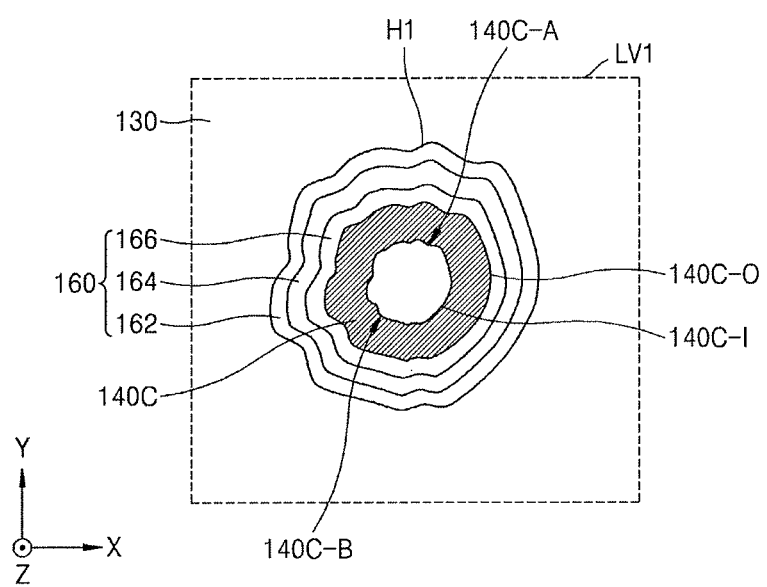
FIGS. 9B and 10B are vertical cross-sectional views at a first vertical level LV1 of FIGS. 9A and 10A according to example embodiments.
Figure 10A:
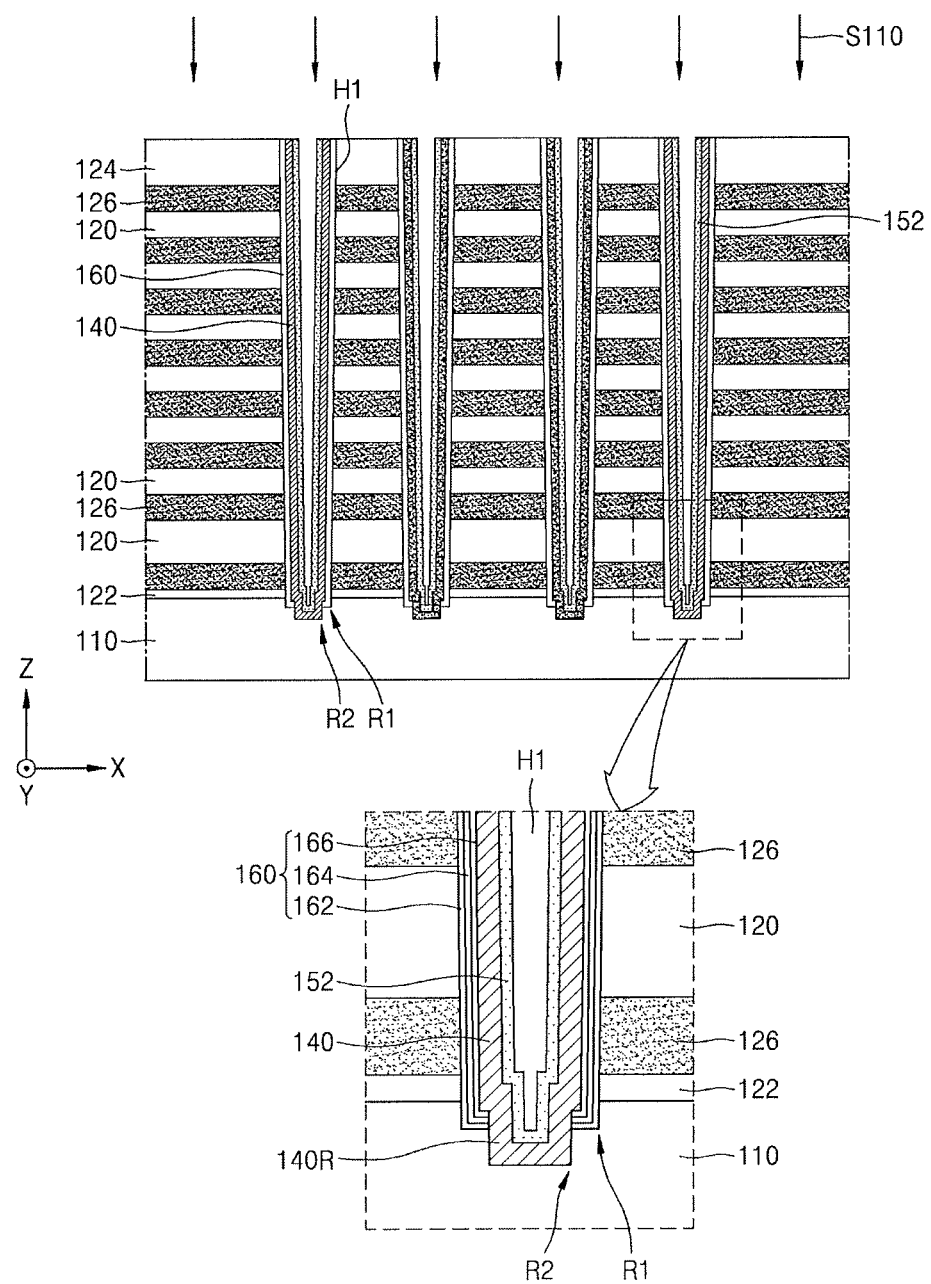
Figure 10B:
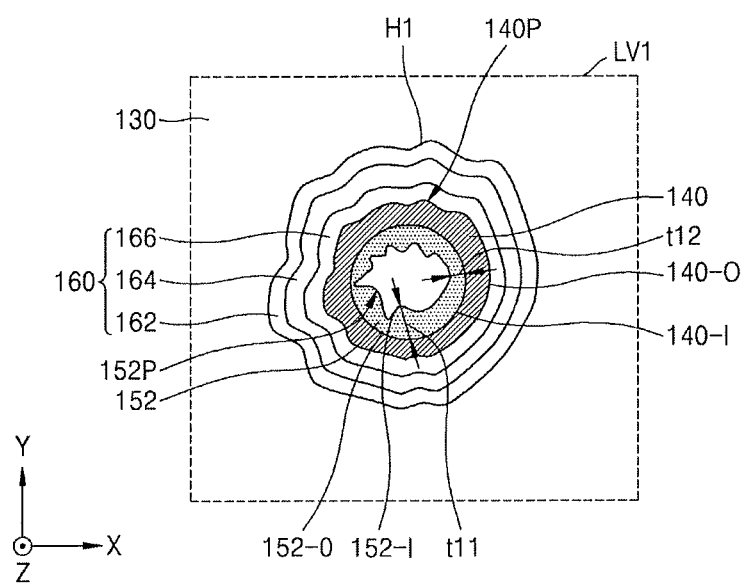

FIGS. 7 and 8, 9A, 10A, and FIGS. 11 to 13 are cross-sectional views illustrating stages in a method of manufacturing the semiconductor device 100 according to example embodiments in a processing order, and FIGS. 9B and 10B are vertical cross-sectional views at a first vertical level LV1 of FIGS. 9A and 10A. In FIGS. 7 to 13, like reference numerals in FIGS. 1 to 6B denote like elements.

Referring to FIG. 7, the lower insulating layer 122 may be formed on the substrate 110, and a plurality of sacrificial layers 126 and a plurality of interlayer insulating layers 120 may be alternately formed on the lower insulating layer 122 along the third direction (Z direction). The upper insulating layer 124 may be formed on the uppermost sacrificial layer 126.

In some example embodiments, the lower insulating layer 122 may be formed by using insulating materials such as SiOx, SiNx, or SiON. However, materials of the first lower insulating layer 122 are not limited thereto, but any material having an etching selectivity with the plurality of sacrificial layers 126 and/or the substrate 110 may be used. Furthermore, the plurality of interlayer insulating layers 120 may be formed by using insulating materials such as SiOx, SiNx, or SiON. In some example embodiments, the plurality of sacrificial layers 126 may be formed by using conductive materials such as SiOx, SiNx, or SiON.

The number of the plurality of sacrificial layers 126 and the plurality of interlayer insulating layers 120 may differ according to the number of gate electrodes 130 (see FIG. 13) to be formed in a subsequent process. Furthermore, thicknesses and/or intervals of the plurality of interlayer insulating layers 120 may be different from each other. In some example embodiments, an interval between a ground selection line and a word line to be formed in subsequent process in a third direction (Z direction) may be adjusted by forming the lowermost interlayer insulating layer 120 thickly.

Next, the vertical channel hole H1 exposing an upper surface of the substrate 110 may be formed by penetrating through the lower insulating layer 122, the plurality of sacrificial layers 126, the plurality of interlayer insulating layers 120, and the upper insulating layer 124.

In some example embodiments, a mask pattern may be formed on the upper insulating layer 124, and the vertical channel hole H1 may be formed by sequentially performing an anisotropic etching process on the upper insulating layer 124, the plurality of sacrificial layers 126, the plurality of interlayer insulating layers 120, and the lower insulating layer 122 until an upper surface of the substrate 110 is exposed by using the mask pattern as an etching mask. In the anisotropic etching process, the first recess area R1 may be formed in the substrate 110 of the vertical channel hole H1 or in an upper portion of the substrate 110 of the vertical channel hole H1.

Referring to FIG. 8, the gate insulating layer 160 may be formed on a sidewall and a bottom portion of the vertical channel hole H1. The gate insulating layer 160 may include the blocking insulating layer 162, the charge storage layer 164, and the tunneling insulating layer 166, which are sequentially stacked. In some example embodiments, the blocking insulating layer 162, the charge storage layer 164, and the tunneling insulating layer 166 may be formed by using an ALD process or a CVD process.

Referring to FIGS. 9A and 9B, the upper surface of the substrate 110 in the vertical channel hole H1 may be exposed by performing an anisotropic etching process on the gate insulating layer 160 covering a bottom portion of the vertical channel hole H1. The second recess area R2 may be formed in the substrate 110 in the vertical channel hole H1 by the anisotropic etching process.

Next, the conductive layer 140C may be formed on the gate insulating layer 160 in the vertical channel hole H1. The conductive layer 140C may be conformally formed on a sidewall of the vertical channel hole H1 with a predetermined thickness in such a manner that the inside of the vertical channel hole H1 is not completely filled. The conductive layer 140C may be a preliminary channel layer which can be converted into the vertical channel layer 140 (see FIG. 10A) after a crystallization operation in a subsequent process. A thickness of the conductive layer 140C may further be greater than that of the resultant vertical channel layer 140 formed in a subsequent process.

In some example embodiments, the conductive layer 140C may be formed by using conductive materials such as polysilicon doped with an impurity. The impurity may control diffusion speed of oxygen into the conductive layer 140C during the annealing process with an oxygen reduction catalyst in operation S110 (see FIG. 10A) to be performed in a subsequent process. For example, the impurity may be phosphor (P), arsenic (As), boron (B), or carbon (C). In-situ doping may be performed on the impurity during a process of forming the conductive layer 140C. Alternatively, the impurity may be implanted in the conductive layer 140C by using an ion implantation process after the conductive layer 140C is formed. However, embodiments are not limited thereto. In some example embodiments, the conductive layer 140C may be formed using conductive materials, e.g., polysilicon not doped with impurities.

As illustrated in FIG. 9B, the vertical channel hole H1 may have a vertical cross-section including a plurality of projecting portions at the first vertical level LV1 (see FIG. 1) relatively close to the upper surface of the substrate 110. In general, when a laminate with an increased height is etched (or when a laminate including a large number of sacrificial layers is etched), a mask pattern may be damaged or consumed with the lapse of an etching time and/or as a depth of the vertical channel hole H1 increases (because the mask pattern is disposed farther from a portion of the laminate to be etched). As a result, a sidewall profile of the vertical channel hole H1 may differ. Therefore, a lower portion of the sidewall of the vertical channel hole H1 may form a striation at the first vertical level LV1 close to the upper surface of the substrate 110. Furthermore, the conductive layer 140C may also form a striation along the sidewall profile of the vertical channel hole H1.

The conductive layer 140C may include an inner wall 140C-I contacting the gate insulating layer 160 and an outer wall 140C-O opposite the inner wall 140C-I. Each of the inner wall 140C-I and the outer wall 140C-O of the conductive layer 140C may include a plurality of projecting portions. In particular, the inner wall 140C-I of the conductive layer 140C may have a vertical cross-section in which a projecting portion 140C-A and a recessed portion 140C-B are partially repeatedly disposed or randomly disposed. The conductive layer 140C may have substantially circular-shaped inner wall and outer wall at the second vertical level LV2 (see FIG. 1) relatively far from an upper surface of the substrate 110.

Referring to FIGS. 10A and 10B, the annealing process with an oxygen reduction catalyst in operation S110 may be performed on the substrate 110 forming the conductive layer 140C (see FIG. 9A) in the vertical channel hole H1.

The annealing process with an oxygen reduction catalyst in operation S110 may include an oxidation operation and a low-temperature annealing operation. In the oxidation operation, oxygen atom or oxygen ion as a catalyst for low-temperature crystallization of the conductive layer 140C may be supplied to and diffused in the conductive layer 140C. During the low-temperature annealing operation, crystallization may be performed in the conductive layer 140C at a relatively low temperature by the oxygen atom or oxygen ion.

In some example embodiments, an oxidation operation and a low-temperature annealing operation may be alternately and sequentially performed during the annealing process with an oxygen reduction catalyst in operation S110. In some example embodiments, the oxidation operation and the low-temperature annealing operation may be simultaneously performed during the annealing process with an oxygen reduction catalyst in operation S110. In some example embodiments, a pre-cleaning operation may further be performed during the annealing process with an oxygen reduction catalyst in operation S110. For example, the pre-cleaning operation, the oxidation operation, and the low-temperature annealing operation may be alternately and sequentially performed. Alternatively, the low-temperature annealing operation may be continuously performed during the annealing process with an oxygen reduction catalyst in operation S110 while the pre-cleaning operation and the oxidation operation are alternately and sequentially performed during the same process. However, embodiments are not limited thereto.

In some example embodiments, the oxidation operation may be performed by using a radical oxidation process, a wet oxidation process, a dry oxidation process, or a plasma oxidation process. The low-temperature heat treatment operation may be performed by using rapid thermal annealing, laser annealing, $N_2$ atmosphere annealing, $H_2$ atmosphere annealing, $O_2$ radical atmosphere annealing, or plasma hydrogen annealing.

The annealing process with an oxygen reduction catalyst in operation S110 may oxidize a part of the conductive layer 140C exposed on an inner wall of the vertical channel hole H1 and may convert the same into an insulating material. Therefore, a predetermined thickness from the exposed surface of the conductive layer 140C may be converted into the first gap-fill insulating layer 152 after the annealing process with an oxygen reduction catalyst in operation S110. Here, a residual portion of the conductive layer 140C after the first gap-fill insulating layer 152 is formed is referred to as the vertical channel layer 140. The vertical channel layer 140 may include a polysilicon layer having high crystal quality and obtained by performing the annealing process with an oxygen reduction catalyst on the conductive layer 140C.

The first gap-fill insulating layer 152 may include SiOx formed of the oxidized part of the conductive layer 140C. As illustrated in FIG. 10B, the first gap-fill insulating layer 152 may have a non-uniform thickness and may be surrounded by the vertical channel layer 140. For example, a part of the first gap-fill insulating layer 152 (for example, a part around a projecting portion 152P) may have the first thickness t11 and the other part of the first gap-fill insulating layer 152 may have the second thickness t12 less than the first thickness t11. This is because a degree of polysilicon oxidation (or an amount of oxidized polysilicon) in the projecting portion 140C-A is different from that in the recessed portion 140C-B as polysilicon particles in the projecting portion 140C-A of the conductive layer 140C are further exposed to an oxidation atmosphere compared to those in the recessed portion 140C-B (see FIG. 9B). Accordingly, the thickness t11 of the first gap-fill insulating layer 152 located in the projecting portion 140C-A may further be greater than the thickness t12 of the first gap-fill insulating layer 152 located in the recessed portion 140C-B of conductive layer 140C.

A thickness of the vertical channel layer 140 may be less than that of the conductive layer 140C because a part of the conductive layer 140C is converted into the first gap-fill insulating layer 152 by the annealing process with an oxygen reduction catalyst in operation S110. In general, a width of the vertical channel hole H1 and a thickness of the vertical channel layer 140 are to be reduced to downscale a memory device. However, crystal quality of the vertical channel layer 140 with a reduced thickness is not good. Therefore, used is a method of performing heat treatment for crystallization after forming a vertical channel layer with a greater thickness, and reducing the thickness of the vertical channel layer by a trimming process. However, according to an embodiment, a thickness of the vertical channel layer 140 may be less than that of the conductive layer 140C due to the annealing process with an oxygen reduction catalyst in operation S110. Therefore, a separate trimming process for reducing a thickness of a vertical channel layer may be omitted.

Figure 11:
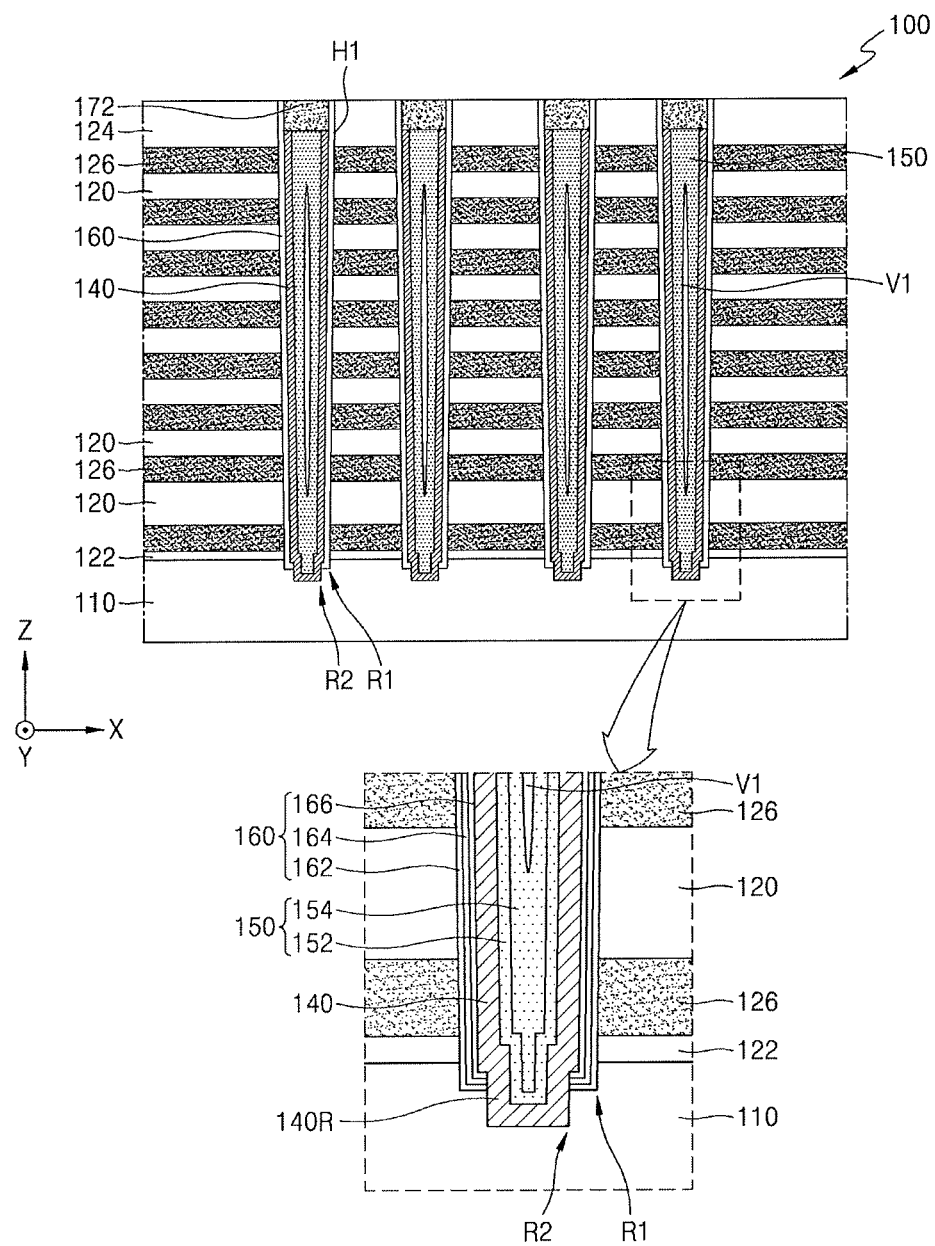

Referring to FIG. 11, the second gap-fill insulating layer 154 may be formed in the vertical channel hole H1 by forming an insulating material on the first gap-fill insulating layer 152 in the vertical channel hole H1 and the upper insulating layer 124 and by performing a planarization process on the insulating material until an upper surface of the upper insulating layer 124 is exposed. The second gap-fill insulating layer 154 may be formed on the first gap-fill insulating layer 152 and may fill a residual space of the vertical channel hole H1 without a void. Alternatively, a void V1 may be formed in some region of the second gap-fill insulating layer 154. The second gap-fill insulating layer 154 may be formed using SiOx, SiON, SiNx, or SiOCN by a CVD process or an ALD process.

Next, an upper portion of the vertical channel layer 140, and the first and second gap-fill insulating layers 152 and 154 may be removed by a predetermined height in the vertical channel hole H1. After a conductive layer filling an empty space of the vertical channel hole H1 is formed on the upper insulating layer 124, the conductive pad 172 may be formed in the vertical channel hole H1 by performing a planarization process on the conductive layer until an upper surface of the upper insulating layer 124 is exposed.

Figure 12:
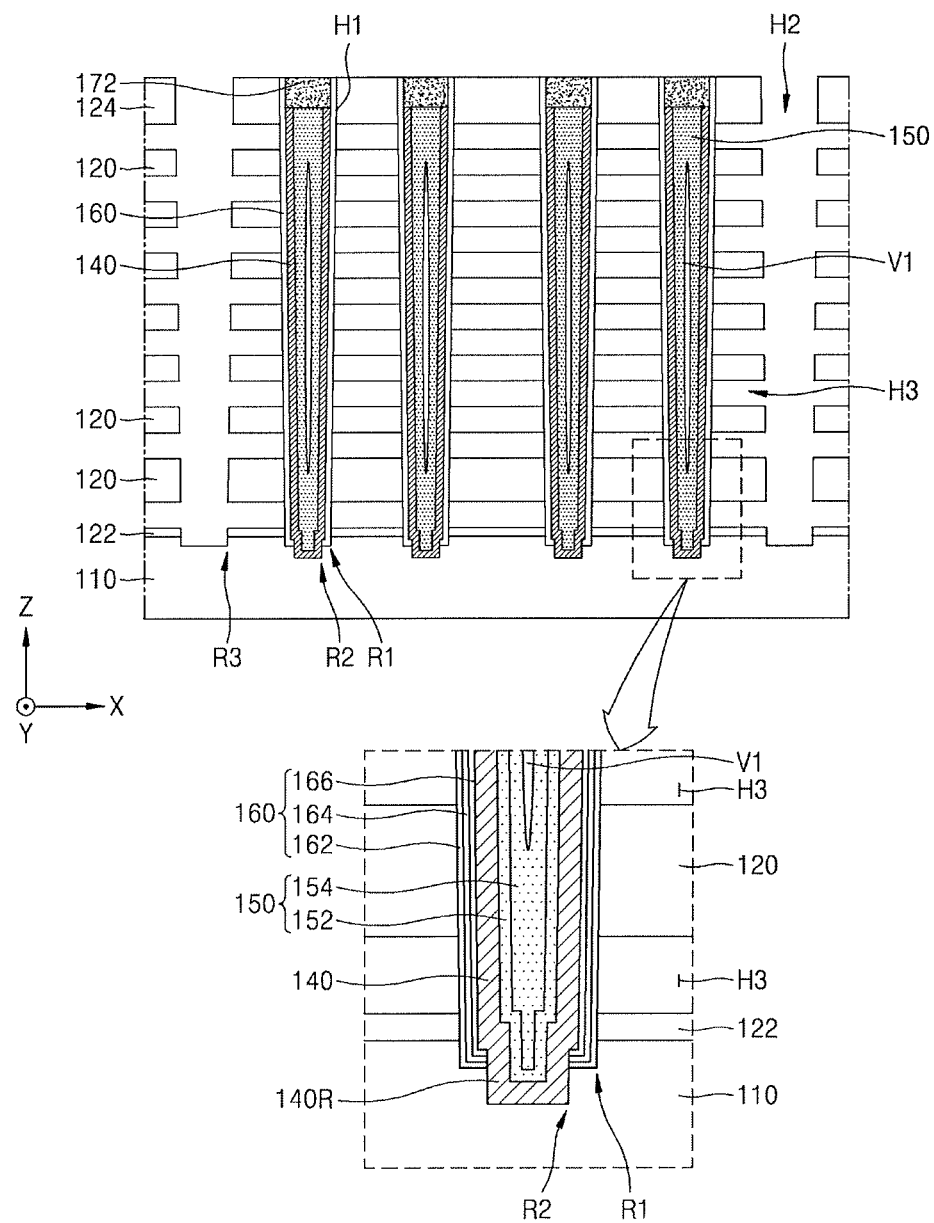

Referring to FIG. 12, an opening H2 exposing an upper surface of the substrate 110 and extending in the second direction (the Y direction) may be formed by sequentially performing an anisotropic etching process on the upper insulating layer 124, the plurality of sacrificial layers 126, the plurality of interlayer insulating layers 120, and the lower insulating layer 122. Next, the plurality of sacrificial layers 126 exposed by the opening H2 may be removed, and a lateral opening H3 may be formed in where the plurality of sacrificial layers 126 are removed.

Figure 13:
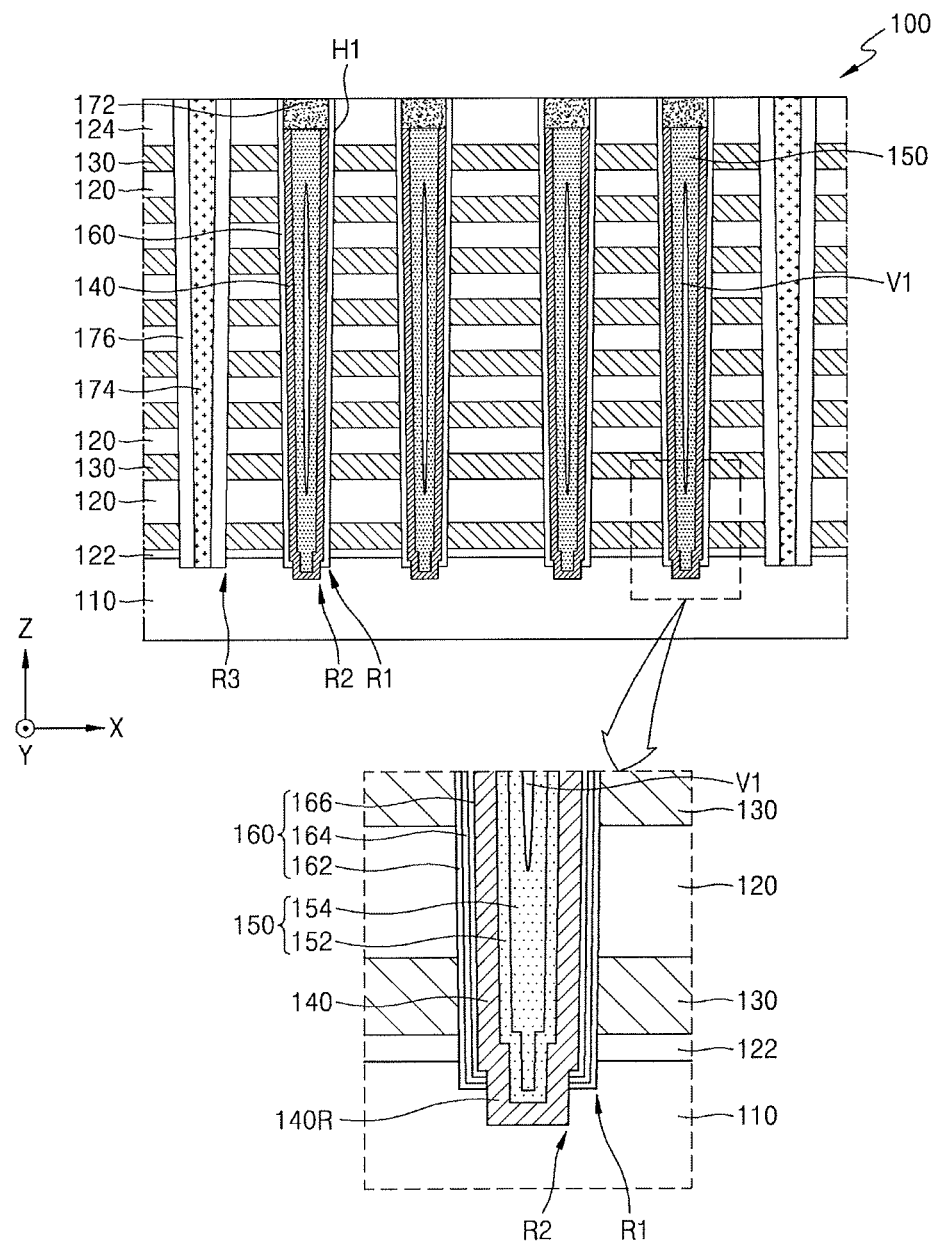

Referring to FIG. 13, after a metal layer filling the opening H2 and the lateral opening H3 is formed, the plurality of gate electrodes 130 may be formed by remaining the metal layer only in the lateral opening H3 by anisotropically etching a portion corresponding to the opening H2 again.

Next, an impurity area may be formed by implanting impurities in the substrate 110 exposed through the opening H2. The impurity area may be a common source area. Next, the common source line spacer 176 covering the common source line 174 and both sidewalls of the common source line 174 may be formed in the opening H2.

According to the method of manufacturing the semiconductor device 100 described above, the vertical channel layer 140 having superior crystal quality may be formed even at a low temperature by the annealing process with an oxygen reduction catalyst in operation S110. Furthermore, the semiconductor device 100 may be manufactured by a method that is simplified as a separate trimming process for reducing a thickness of the vertical channel layer 140 is omitted.

Figure 14:
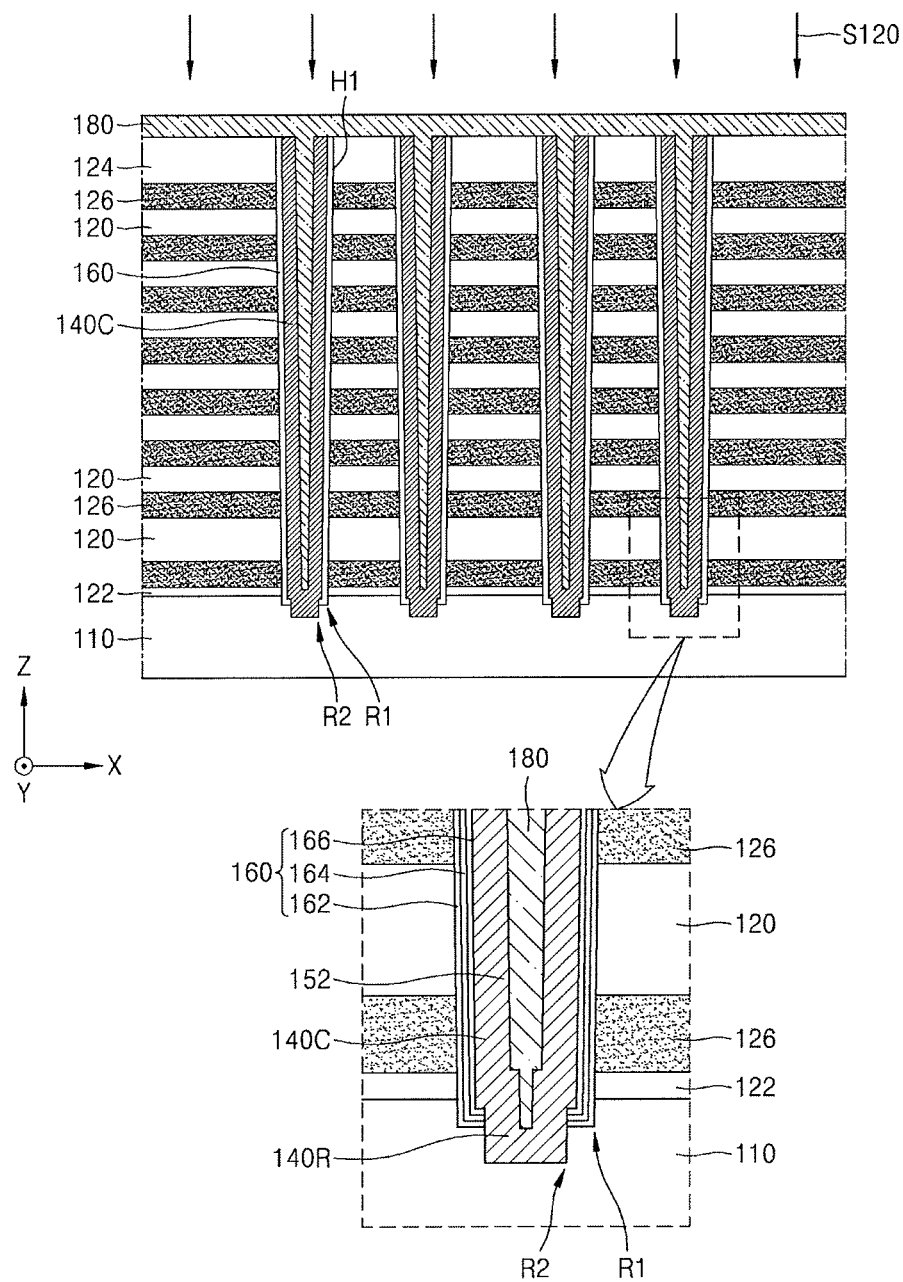
FIGS. 14 and 15 illustrate cross-sectional views of stages in a method of manufacturing a semiconductor device according to example embodiments.
Figure 15:
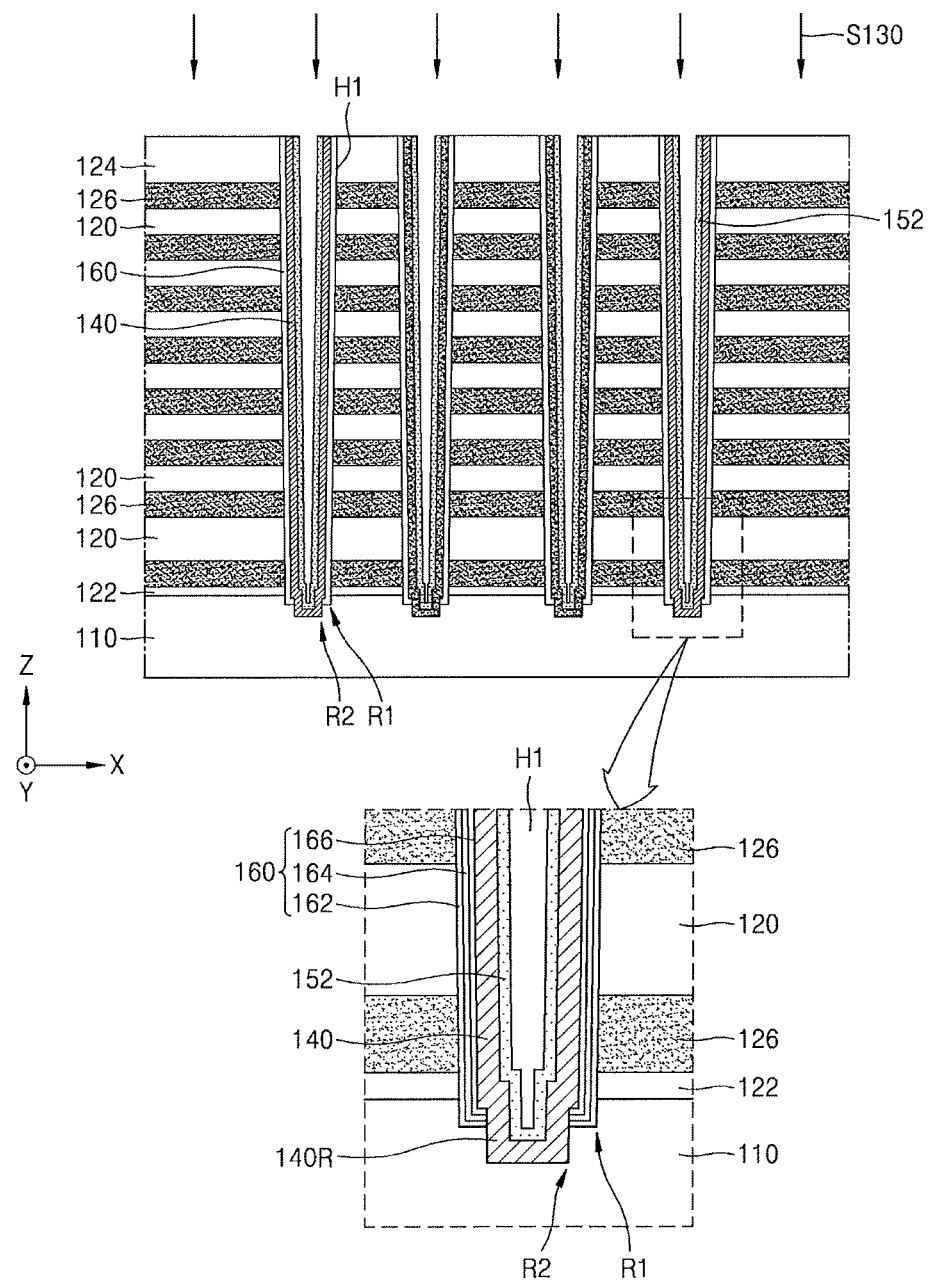

FIGS. 14 and 15 are cross-sectional views illustrating stages in a method of manufacturing the semiconductor device 100 according to example embodiments. In FIGS. 14 and 15, like reference numerals in FIGS. 1 to 13 denote like elements.

First, a structure including the conductive layer 140C in the vertical channel hole H1 is formed by performing processes described with reference to FIGS. 7 to 9B.

Referring to FIG. 14, a crystallization catalyst-containing layer 180 may be formed on the upper insulating layer 124 and the conductive layer 140C. The crystallization catalyst-containing layer 180 may cover the conductive layer 140C and may completely fill the vertical channel hole H1.

Alternatively, the crystallization catalyst-containing layer 180 may be conformally formed on the conductive layer 140C and a part of the inner space of the vertical channel hole H1 may not be filled.

In some example embodiments, the crystallization catalyst-containing layer 180 may be an insulating material layer including oxygen. For example, the crystallization catalyst-containing layer 180 may include SiOx, SiON, SiOC, or SiOCN. Furthermore, the crystallization catalyst-containing layer 180 may further include an impurity to control diffusion. For example, the impurity may be P, As, B, or C.

Next, by performing a heat treatment process at a low-temperature of operation S120 on the structure including the crystallization catalyst-containing layer 180, oxygen may be diffused from the crystallization catalyst-containing layer 180 to the inside of the conductive layer 140C. The heat treatment process at a low-temperature of operation S120 may be performed by using rapid thermal annealing, laser annealing, $N_2$ atmosphere annealing, $H_2$ atmosphere annealing, $O_2$ radical atmosphere annealing, or plasma hydrogen annealing.

During the heat treatment process at a low-temperature of operation S120, the conductive layer 140C may be crystallized even at a relatively low temperature because oxygen atom or oxygen ion diffused from the crystallization catalyst-containing layer 180 functions as a catalyst for crystallization in the conductive layer 140C.

Referring to FIG. 15, the crystallization catalyst-containing layer 180 (see FIG. 14) may be removed.

An oxidation process of operation S130 may be performed on a structure including a re-exposed surface of the conductive layer 140C (see FIG. 14) in the vertical channel hole H1. For example, the oxidation process of operation S130 may be performed by using a radical oxidation process, a wet oxidation process, a dry oxidation process, or a plasma oxidation process.

A part of the conductive layer 140C may be converted into the first gap-fill insulating layer 152 by the oxidation process of operation S130, and a vertical channel layer 140 with a reduced thickness may be obtained from the remaining portion of the conductive layer 140C.

According to the method of manufacturing the semiconductor device 100 described above, the vertical channel layer 140 having superior crystal quality may be formed even at a low temperature by forming the crystallization catalyst-containing layer 180. Furthermore, the semiconductor device 100 may be manufactured by a method that is simplified as a separate trimming process for reducing a thickness of the vertical channel layer 140 is omitted.

FIGS. 16 to 21 are cross-sectional views illustrating stages in a method of manufacturing the semiconductor device 100A according to example embodiments. In FIGS. 16 to 21, like reference numerals in FIGS. 1 to 15 denote like elements.

Figure 16:
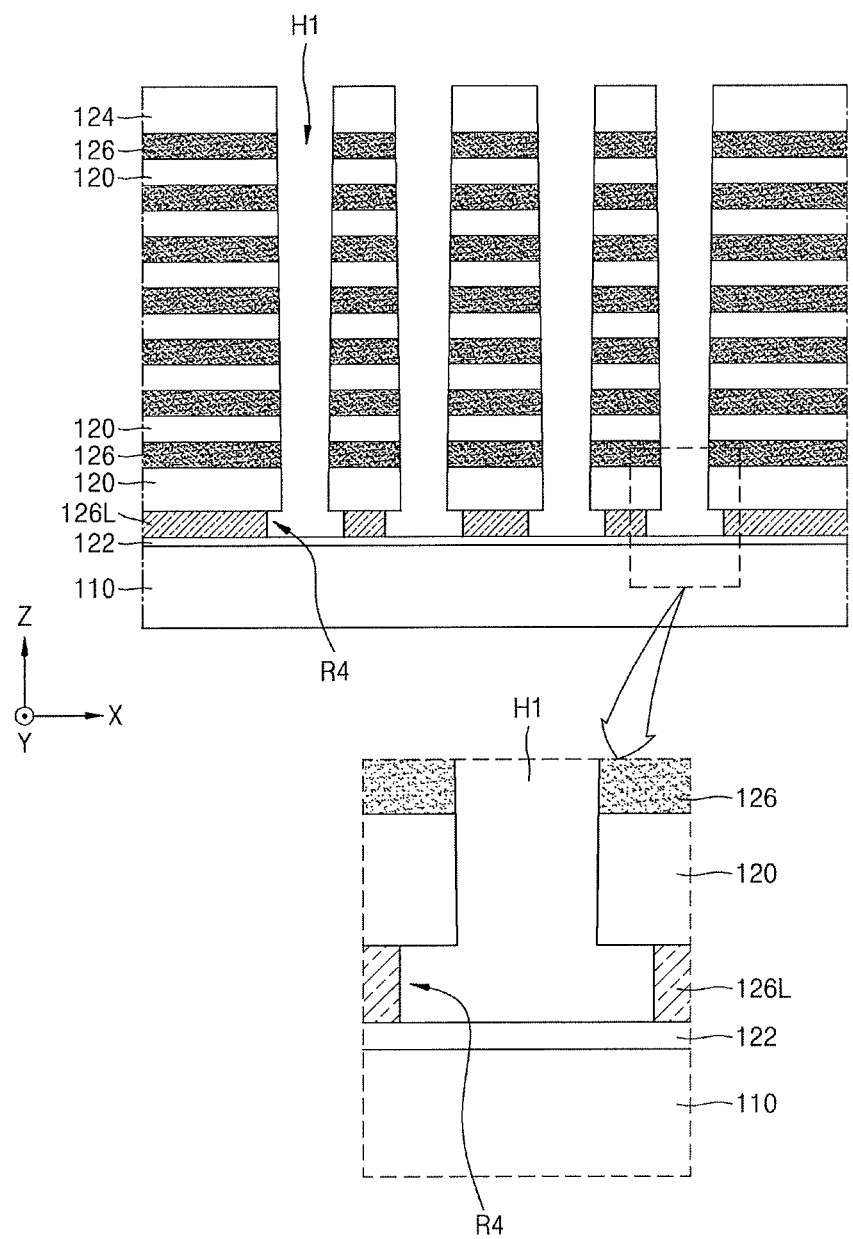
FIGS. 16 to 21 illustrate cross-sectional views of stages in a method of manufacturing a semiconductor device according to example embodiments.

Referring to FIG. 16, the lower insulating layer 122 and the lower sacrificial layer 126L are sequentially formed on the substrate 110, the plurality of interlayer insulating layers 120 and the plurality of sacrificial layers 126 are alternately formed on the lower sacrificial layer 126L, and the upper insulating layer 124 may be formed on the uppermost sacrificial layer 126.

The lower sacrificial layer 126L may be formed of a material different from that of the plurality of sacrificial layers 126. For example, when the plurality of sacrificial layers 126 include SiNx, the lower sacrificial layer 126L may include polysilicon doped or not doped with impurities. However, materials of the lower sacrificial layer 126L are not limited thereto. The lower sacrificial layer 126L may include any material having an etching selectivity with both the plurality of interlayer insulating layers 120 and the plurality of sacrificial layers 126.

Next, the vertical channel hole H1 may be formed by sequentially performing an anisotropic etching process on the upper insulating layer 124, the plurality of sacrificial layers 126, and the plurality of interlayer insulating layers 120. Here, an upper surface of the lower sacrificial layer 126L may be exposed to a bottom portion of the vertical channel hole H1. Next, by removing the lower sacrificial layer 126L, the fourth recess area R4 enlarged in a lateral direction with respect to a sidewall of the vertical channel hole H1 may be formed and an upper surface of the lower insulating layer 122 may be exposed.

Figure 17:
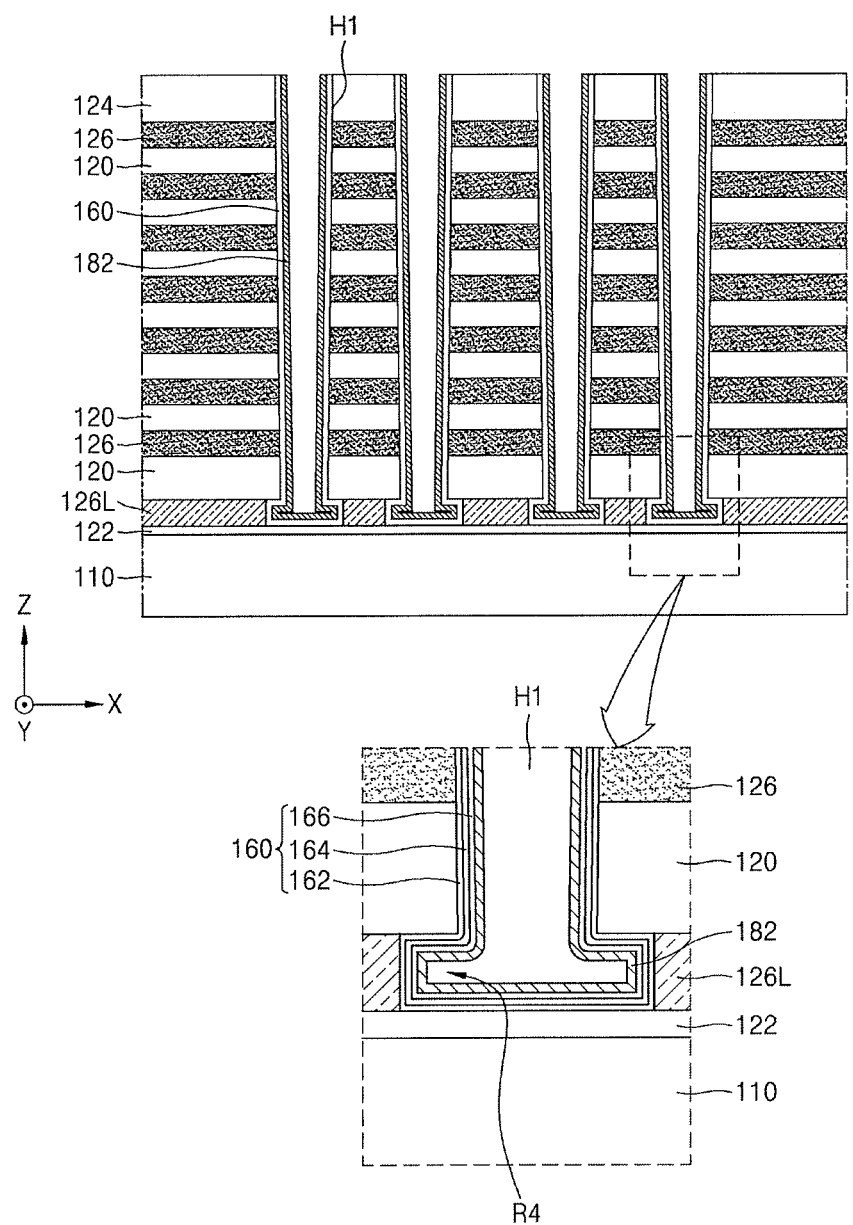

Referring to FIG. 17, the gate insulating layer 160 may be conformally formed on an inner wall of the vertical channel hole H1 and the fourth recess area R4.

A spacer 182 may be formed on the gate insulating layer 160. The spacer 182 may be formed of a material having an etching selectivity with the gate insulating layer 160. For example, the spacer 182 may be formed of polysilicon. The spacer 182 may protect the gate insulating layer 160 in a subsequent process.

Figure 18:
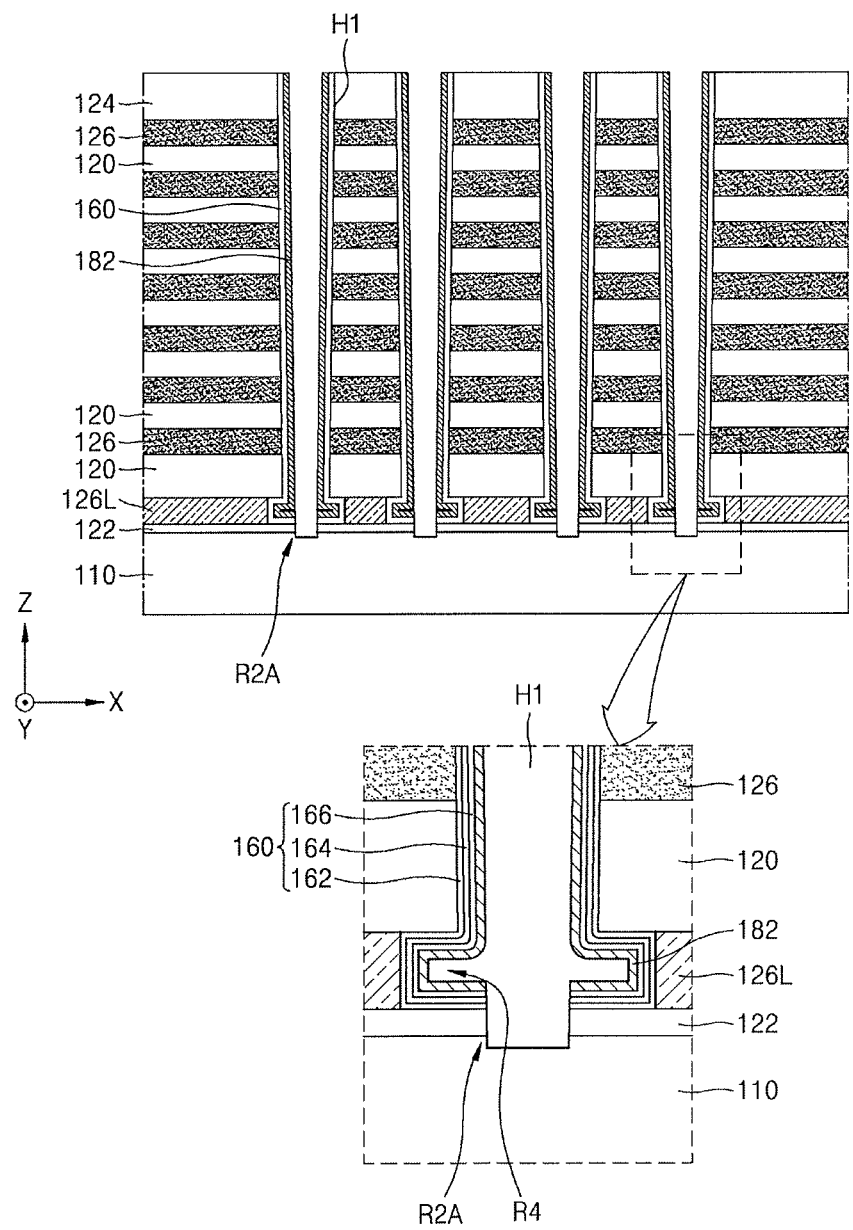

Referring to FIG. 18, the gate insulating layer 160 and the lower insulating layer 122 in the bottom portion of the vertical channel hole H1 and the fourth recess area R4 may be etched by using the spacer 182 as an etching mask. Therefore, the vertical channel hole H1 and the fourth recess area R4 may expose a surface of the substrate 110, and furthermore, may form the second recess area R2A in the substrate 110 by sufficiently etching the lower insulating layer 122.

Figure 19:
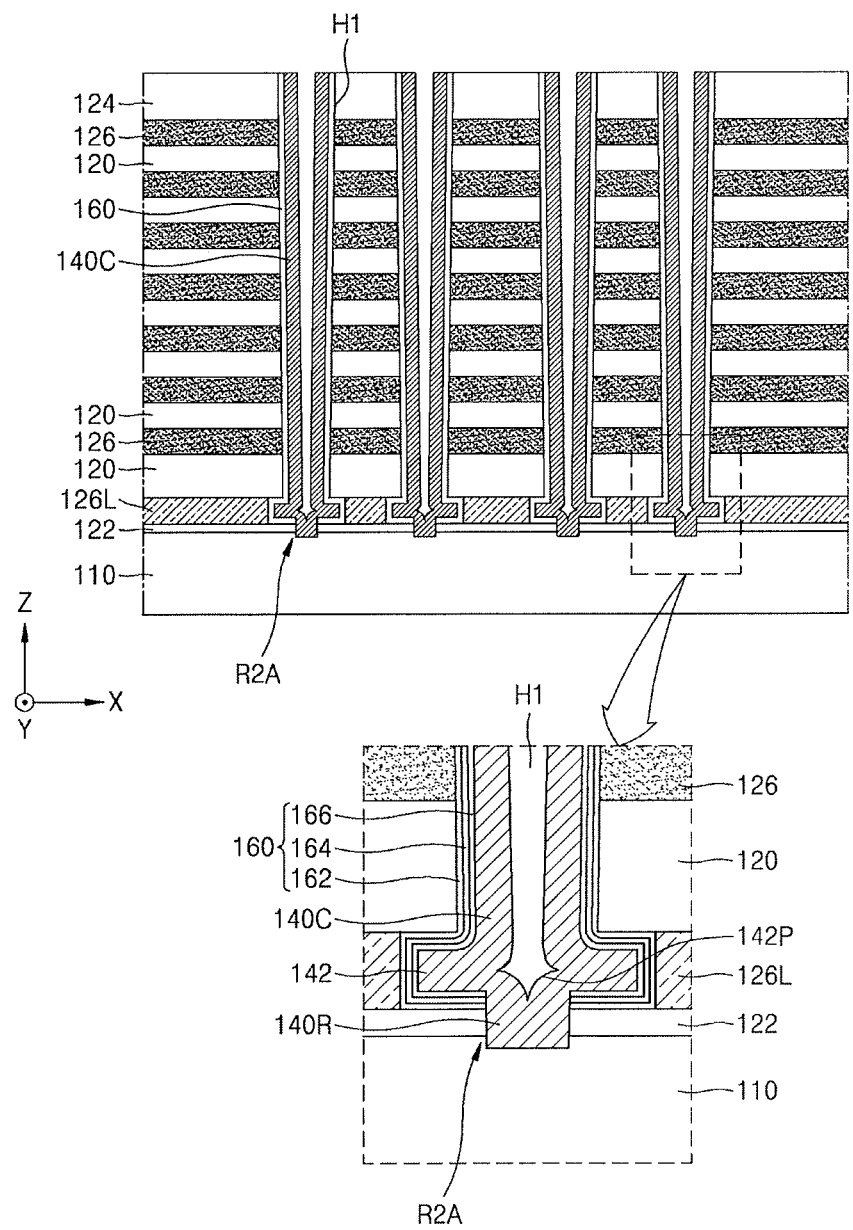

Referring to FIG. 19, the spacer 182 disposed on a sidewall of the vertical channel hole H1 and the fourth recess area R4 may be removed. The spacer 182 may be removed by using an etchant for polysilicon.

Figure 20:
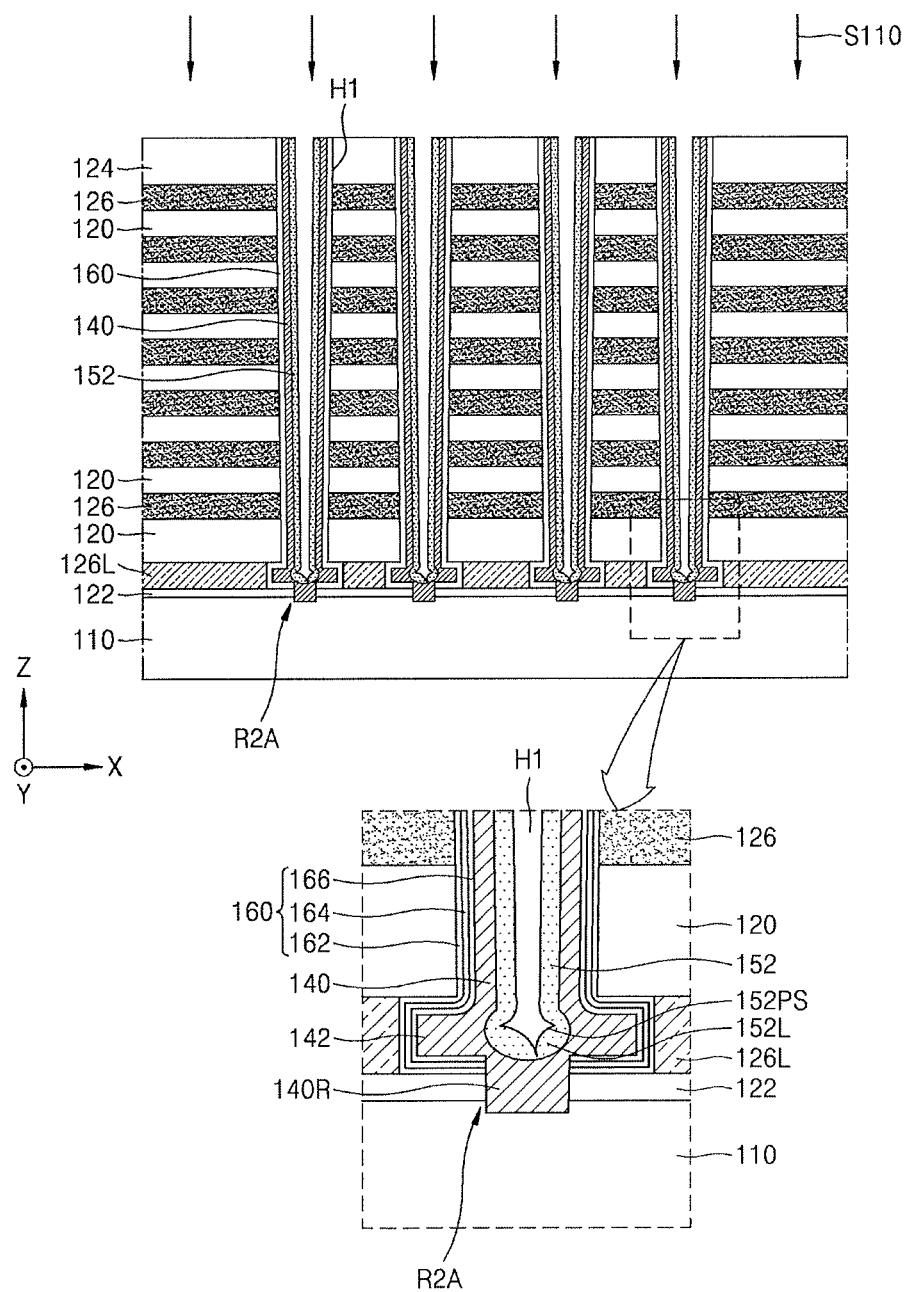

Referring to FIG. 20, the conductive layer 140C may be formed on the gate insulating layer 160 in the vertical channel hole H1 and the fourth recess area R4 and on the substrate 110. The conductive layer 140C may fill a bottom portion of the second recess area R2A and may contact an upper surface of the substrate 110.

Here, a part of the conductive layer 140C filling the fourth recess area R4 may be referred to as the lower contact area 142. Since the fourth recess area R4 is a space extending in a lateral direction from a sidewall of the vertical channel hole H1, the lower contact area 142 may not completely fill the fourth recess area R4. The lower contact area 142 may include the projecting portion 142P and a surface of the projecting portion 142P may be exposed to an inside of the vertical channel hole H1.

Referring to FIG. 20, the annealing process with an oxygen reduction catalyst in operation S110 may be performed on the substrate 110 on which the conductive layer 140C (see FIG. 19) in the vertical channel hole H1 is formed. The annealing process with an oxygen reduction catalyst in operation S110 may be understood by referring to the description with reference to FIGS. 10A and 10B.

The first gap-fill insulating layer 152 may be formed from a part of the conductive layer 140C by the annealing process with an oxygen reduction catalyst in operation S110.

When the projecting portion 142P of the lower contact area 142 is exposed to the vertical channel hole H1, the projecting portion 142P may be preferentially oxidized by the annealing process with an oxygen reduction catalyst in operation S110 or oxidation speed of the projecting portion 142P may be faster than that of the other portion. Therefore, a thickness of the lower portion 152L of the first gap-fill insulating layer 152 may be relatively great, and may further be greater than a thickness of the first gap-fill insulating layer 152 disposed on a sidewall of the vertical channel hole H1. The lower portion 152L of the first gap-fill insulating layer 152 may include the plurality of projecting surfaces 152PS, and the cavity area V2 may be defined by the plurality of projecting surfaces 152PS.

Figure 21:
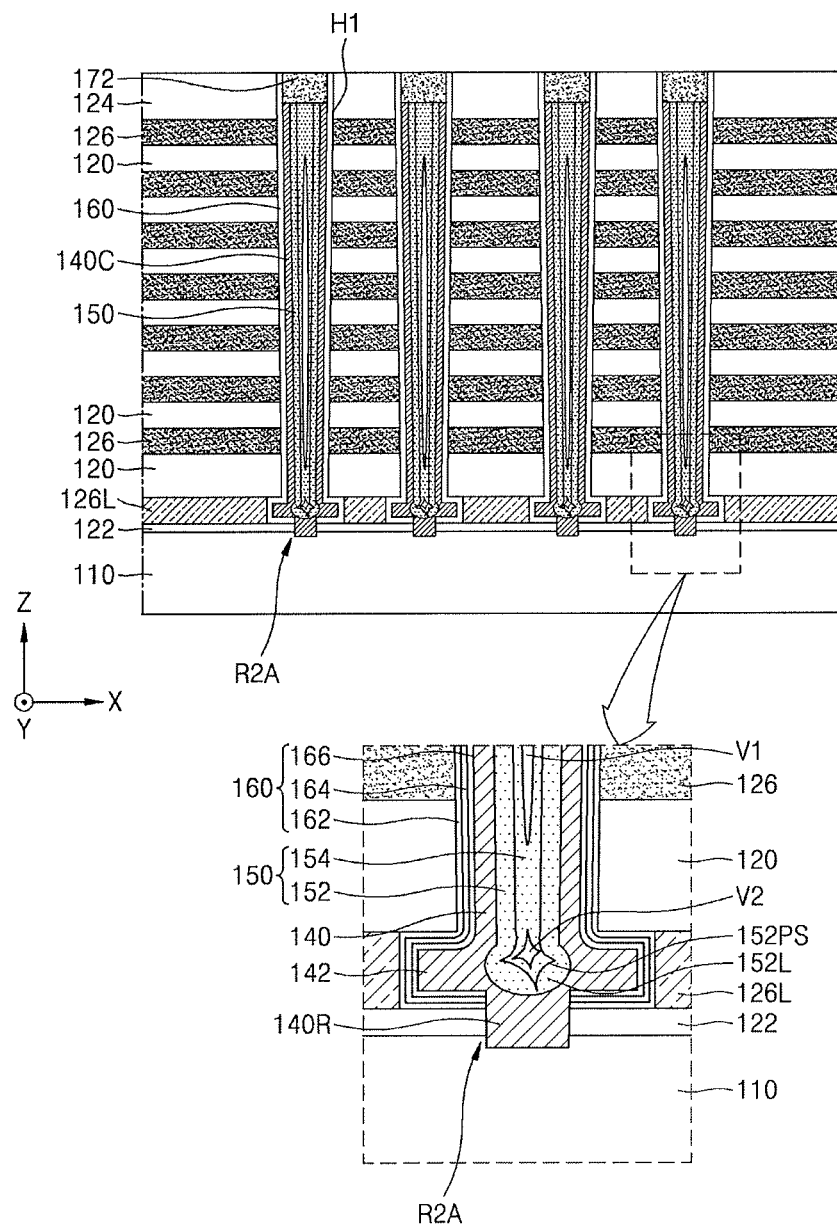

Referring to FIG. 21, the second gap-fill insulating layer 154 may be formed in the vertical channel hole H1 by forming an insulating material on the first gap-fill insulating layer 152 in the vertical channel hole H1 and the upper insulating layer 124 and by performing a planarization process on the insulating material until an upper surface of the upper insulating layer 124 is exposed. The second gap-fill insulating layer 154 may not completely fill the cavity area V2, and the cavity area V2 may be remained in a portion adjacent to the lower contact area 142.

Next, the processes described with reference to FIGS. 11 to 13 may be performed.

According to the method of manufacturing the semiconductor device 100A described above, the vertical channel layer 140 having superior crystal quality may be formed even at a low temperature by the annealing process with an oxygen reduction catalyst in operation S110. Furthermore, the semiconductor device 100A may be manufactured by a method that is simplified as a separate trimming process for reducing a thickness of the vertical channel layer 140 is omitted.

By way of summation and review, one or more embodiments provide a semiconductor device having high electrical characteristics and/or a method of manufacturing a semiconductor device by a simplified process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a plurality of gate electrodes on the substrate, the plurality of gate electrodes extending in a first direction parallel to an upper surface of the substrate and alternately arranged with an interlayer insulating layer in a second direction perpendicular to the upper surface of the substrate;
a vertical channel layer on a sidewall of a vertical channel hole extending in the second direction by penetrating through the plurality of gate electrodes and the interlayer insulating layer, and connected to the upper surface of the substrate; and
a first gap-fill insulating layer formed in the vertical channel hole and including an outer wall contacting the vertical channel layer and an inner wall opposite the outer wall, wherein a part of the inner wall projects inwardly to provide the inner wall with an uneven surface and forms a striation extending in the second direction.

2. The semiconductor device as claimed in claim 1, wherein the inner wall of the first gap-fill insulating layer has a cross-section different from a circular shape.

3. The semiconductor device as claimed in claim 1, wherein:
the outer wall of the first gap-fill insulating layer has a circular-shaped cross-section, and
the cross-section of the inner wall of the first gap-fill insulating layer has a polygonal shape including a plurality of projecting portions.

4. The semiconductor device as claimed in claim 1, wherein:
the first gap-fill insulating layer has a non-uniform thickness in a direction perpendicular to the second direction, and
the vertical channel layer has a non-uniform thickness in a direction surrounding the first gap-fill insulating layer.

5. The semiconductor device as claimed in claim 1, wherein:
the vertical channel layer includes an inner wall contacting an outer wall of the first gap-fill insulating layer and an outer wall opposite the inner wall,
the outer wall of the vertical channel layer has a striation at a first vertical level, and
the outer wall of the vertical channel layer does not have a striation at a second vertical level farther from the upper surface of the substrate than the first vertical level.

6. The semiconductor device as claimed in claim 5, wherein:
at the first vertical level, the outer wall of the vertical channel layer has a cross-section different from a circular shape, and
at the first vertical level, the inner wall of the vertical channel layer has a circular-shaped cross-section.

7. The semiconductor device as claimed in claim 1, wherein:
the inner wall of the first gap-fill insulating layer has a cross-section different from a circular shape at a first vertical level, and
the inner wall of the first gap-fill insulating layer has a circular shaped cross-section at a second vertical level farther from the upper surface of the substrate than the first vertical level.

8. The semiconductor device as claimed in claim 1, further comprising:
a second gap-fill insulating layer in the vertical channel hole and contacting an inner wall of the first gap-fill insulating layer,
wherein the first and second gap-fill insulating layers completely fill the vertical channel hole or a void is formed in the second gap-fill insulating layer.

9. A semiconductor device, comprising:
a substrate;
a plurality of gate electrodes on the substrate, the plurality of gate electrodes extending in a first direction parallel to an upper surface of the substrate and alternately arranged with an interlayer insulating layer in a second direction perpendicular to the upper surface of the substrate;

a vertical channel layer on a sidewall of a vertical channel hole extending in the second direction by penetrating through the plurality of gate electrodes and the interlayer insulating layer; and a first gap-fill insulating layer in the vertical channel hole and including an outer wall contacting the vertical channel layer and an inner wall opposite the outer wall, wherein the inner wall of the first gap-fill insulating layer has a cross-section different from a circular shape.

10. The semiconductor device as claimed in claim 9, wherein:
a part of the vertical channel layer has a striation extending in the second direction, and
a part of the inner wall of the first gap-fill insulating layer has a striation extending in the second direction.

11. The semiconductor device as claimed in claim 9, wherein
the inner wall of the first gap-fill insulating layer has a polygonal-shaped cross-section including a plurality of projecting portions, and
the outer wall of the first gap-fill insulating layer has a circular-shaped cross-section.

12. The semiconductor device as claimed in claim 9, wherein:
the vertical channel layer includes an inner wall contacting the first gap-fill insulating layer and an outer wall opposite the inner wall,
the inner wall of the vertical channel layer has a circular-shaped cross-section, and
the outer wall of the vertical channel layer has a polygonal-shaped vertical cross-section including a plurality of projecting portions.

13. The semiconductor device as claimed in claim 9, wherein:
the vertical channel layer has a non-uniform thickness along the first direction at a first vertical level adjacent to the upper surface of the substrate and a uniform thickness at a second vertical level spaced from the upper surface of the substrate along the second direction; and
the first gap-fill insulating layer has a non-uniform thickness at the first vertical level and a uniform thickness at the second vertical level.

14. The semiconductor device as claimed in claim 9, wherein the inner wall of the first gap-fill insulating layer has a cross-section different from a circular shape at a first vertical level adjacent to the upper surface of the substrate and a circular-shaped cross-section at a second vertical level spaced from the upper surface of the substrate along the second direction.

15. A semiconductor device, comprising:
a substrate;
a plurality of gate electrodes on the substrate, the plurality of gate electrodes extending in a first direction parallel to an upper surface of the substrate and alternately arranged with an interlayer insulating layer in a second direction perpendicular to the upper surface of the substrate;
a vertical channel layer on a sidewall of a vertical channel hole extending in the second direction by penetrating through the plurality of gate electrodes and the interlayer insulating layer, and in contact with the upper surface of the substrate; and
a first gap-fill insulating layer in the vertical channel hole, the first gap-fill insulating layer having an inner wall and an outer wall opposite the inner wall,
wherein the inner wall of the first gap-fill insulating layer has a cross-section different from a circular shape at a first vertical level adjacent to the upper surface of the substrate and a circular-shaped cross-section at a second vertical level spaced from the upper surface of the substrate along the second direction.

16. The semiconductor device as claimed in claim 15, wherein:
the vertical channel layer has a non-uniform thickness along the first direction at the first vertical level and a uniform thickness at the second vertical level; and
the first gap-fill insulating layer has a non-uniform thickness at the first vertical level and a uniform thickness at the second vertical level.

17. The semiconductor device as claimed in claim 16, wherein:
a part of the vertical channel layer has a striation extending in the second direction, and
a part of the inner wall of the first gap-fill insulating layer has a striation extending in the second direction.

18. The semiconductor device as claimed in claim 16, wherein an inner wall of the vertical channel layer and an outer wall of the first gap-fill insulating layer have a circular shape at both the first and second vertical levels.

19. The semiconductor device as claimed in claim 15, wherein:
at the first vertical level, the inner wall of the first gap-fill insulating layer has a cross-section different from a circular shape, and
at the first vertical level, the outer wall of the first gap-fill insulating layer has a circular-shaped cross-section.

20. The semiconductor device as claimed in claim 15, further comprising:
a second gap-fill insulating layer in the vertical channel hole and contacting an inner wall of the first gap-fill insulating layer,
wherein the first and second gap-fill insulating layers completely fill the vertical channel hole or a void is formed in the second gap-fill insulating layer.

* * * * *